United States Patent
Lee et al.

(10) Patent No.: US 10,504,964 B2
(45) Date of Patent: Dec. 10, 2019

(54) IMAGE SENSORS AND METHODS FOR MANUFACTURING THE SAME

(71) Applicant: SAMSUNG ELECTRONICS CO., LTD., Suwon-si, Gyeonggi-do (KR)

(72) Inventors: Beom Suk Lee, Yongin-si (KR); Kwang-Min Lee, Seoul (KR); Gwideok Ryan Lee, Suwon-si (KR); Masaru Ishii, Hwaseong-si (KR); Tae Yon Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/659,343

(22) Filed: Jul. 25, 2017

(65) Prior Publication Data
US 2018/0197919 A1   Jul. 12, 2018

(30) Foreign Application Priority Data
Jan. 9, 2017   (KR) .......................... 10-2017-0002923

(51) Int. Cl.
*H01L 27/30*   (2006.01)
*H01L 27/28*   (2006.01)
*H01L 51/44*   (2006.01)

(52) U.S. Cl.
CPC .......... *H01L 27/307* (2013.01); *H01L 27/281* (2013.01); *H01L 27/286* (2013.01); *H01L 51/442* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 9,006,566 B2 | 4/2015 | Ihama | |
| 9,219,100 B2 | 12/2015 | Yamaguchi et al. | |
| 9,293,722 B2 | 3/2016 | Miyanami | |
| 9,343,508 B2 | 5/2016 | Ichiki | |
| 2013/0020663 A1 | 1/2013 | Takimoto | |
| 2014/0001454 A1 | 1/2014 | Miyanami et al. | |
| 2015/0188064 A1* | 7/2015 | Kim | H01L 27/14645 257/40 |
| 2015/0207087 A1 | 7/2015 | Udaka et al. | |
| 2016/0133865 A1* | 5/2016 | Yamaguchi | H01L 27/14623 257/40 |
| 2017/0323932 A1* | 11/2017 | Hatano | H01L 27/307 |
| 2018/0047789 A1* | 2/2018 | Yamaguchi | H01L 27/286 |

FOREIGN PATENT DOCUMENTS

WO   WO 2014/024581 A1   2/2014

* cited by examiner

*Primary Examiner* — Walter H Swanson
*Assistant Examiner* — Kien C Ly
(74) *Attorney, Agent, or Firm* — Myers Bigel, P.A.

(57) ABSTRACT

Image sensors according to some embodiments of the inventive concepts may include a pixel array are including a plurality of pixels, a peripheral area adjacent the pixel array unit, and an organic photoelectric converting layer including a first portion positioned on the pixel area and a second portion positioned on the peripheral area. The second portion may be separated from the first portion.

20 Claims, 14 Drawing Sheets

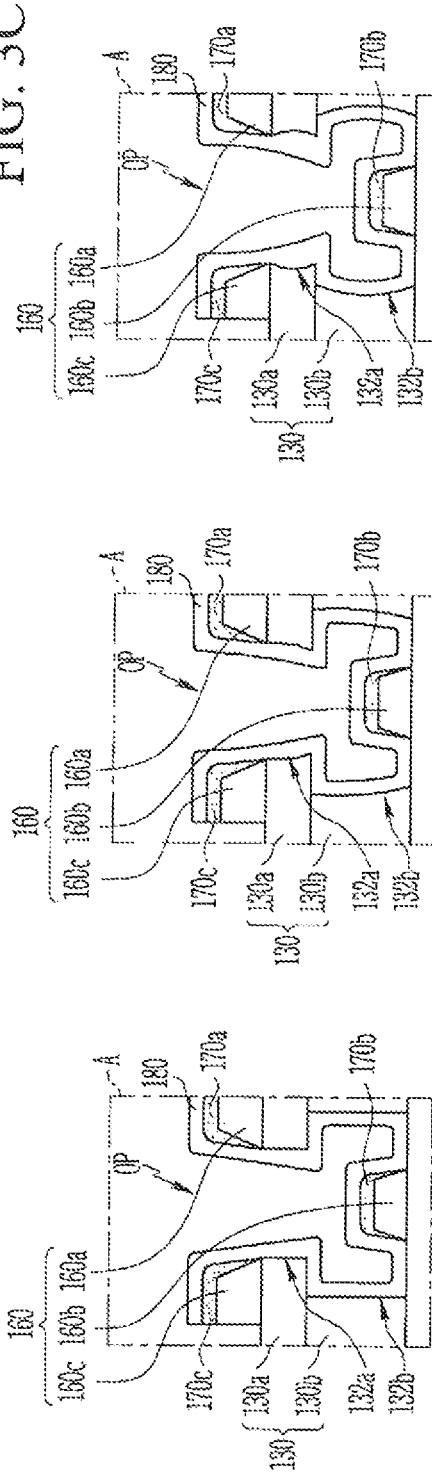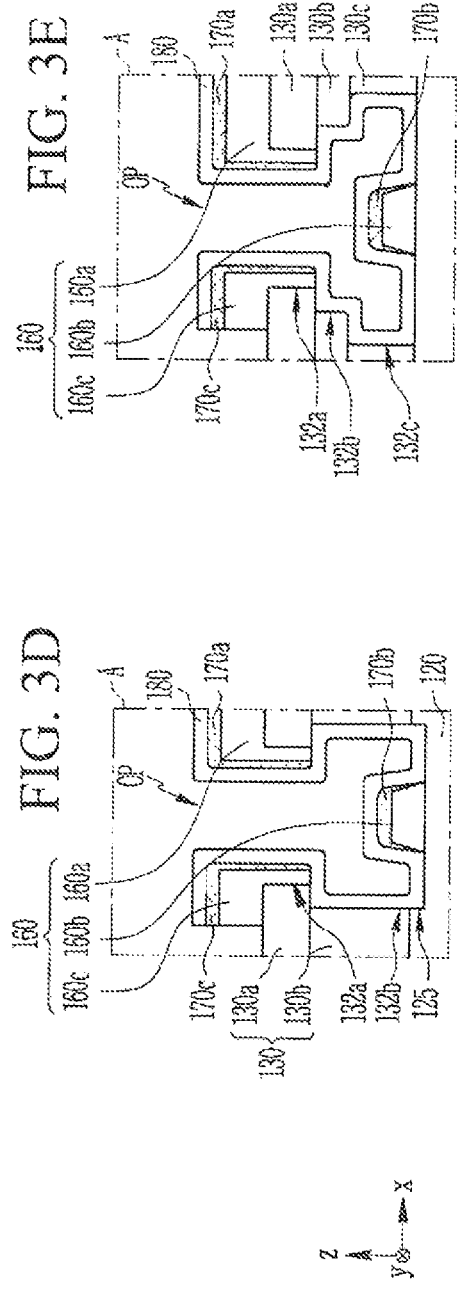

IMAGE SENSORS AND METHODS FOR MANUFACTURING THE SAME

CROSS-REFERENCE TO RELATED APPLICATION

This application claims priority to Korean Patent Application No. 10-2017-0002923 filed in the Korean Intellectual Property Office on Jan. 9, 2017, the disclosure of which is hereby incorporated herein by reference in its entirety.

BACKGROUND

The present disclosure relates to image sensors, methods for manufacturing the image sensors, and electronic devices including the image sensors.

Electronic devices, such as a digital camera and a smart phone, having a function of photographing an image may include image sensors. Image sensors may include, for example, a charged coupled device (CCD) image sensor or a complementary metal oxide semiconductor (CMOS) image sensor as a semiconductor device converting optical information into an electric signal. CMOS image sensors are widely used.

Image sensors may include pixels including photoelectric converters and transistors. Signals photoelectrically converted by the photoelectric converters may be processed by the transistors and may be output as pixel signals, and image data may be generated based on the pixel signals.

Recently, demand for high resolution image sensors has increased, and in this respect, a size of a pixel has decreased. In the case of an inorganic photoelectric converter formed in a semiconductor substrate, a light absorption area decreases as a size of a pixel decreases, and thus sensitivity may decrease. Accordingly, an organic photoelectric converter including an organic photoelectric converting layer, which is capable of replacing or supplementing an inorganic photoelectric converter, has been researched.

SUMMARY

The present inventive concepts have been made in an effort to provide an image sensor, which is capable of reducing or possibly preventing damage to an organic photoelectric converting layer during a manufacturing process and degradation of a characteristic of an organic photoelectric converter of a pixel. The present inventive concepts have been made in an effort to provide a method for manufacturing an image sensor, which is capable of forming an organic photoelectric converting layer with a simple manufacturing process and reducing or possibly preventing damage to the organic photoelectric converting layer.

Image sensors according to some embodiments of the inventive concepts may include a pixel array are including a plurality of pixels, a peripheral area adjacent the pixel array unit, and an organic photoelectric converting layer including a first portion positioned on the pixel area and a second portion positioned on the peripheral area. The second portion may be separated from the first portion.

Image sensors according to some embodiments of the present inventive concepts may include an underlying structure that includes a pixel array area and a peripheral area adjacent the pixel array area. The pixel array area may include a plurality of pixels. The image sensors may also include an insulating layer on the pixel array area, and the insulating layer may expose a portion of the peripheral area. The image sensors may further include a first organic photoelectric converting layer on the insulating layer on the pixel array area and a second organic photoelectric converting layer on the portion of the peripheral area. The insulating layer and the first organic photoelectric converting layer may be sequentially stacked on the underlying structure in a vertical direction, and the first organic photoelectric converting layer may be spaced apart from the second organic photoelectric converting layer in the vertical direction.

Image sensors according to some embodiments of the present inventive concepts may include an underlying structure that includes a pixel array area and a peripheral area adjacent the pixel array area. The pixel array area may include a plurality of pixels. The image sensors may also include a first insulating layer on the pixel array area and a second insulating layer on the peripheral area, and the first insulating layer and the second insulating layer may be spaced apart from each other in a horizontal direction and may define a recess therebetween. The image sensors may further include a first organic photoelectric converting layer on the first insulating layer on the pixel array area and a second organic photoelectric converting layer in the recess. The first organic photoelectric converting layer may be spaced apart from the second organic photoelectric converting layer in a vertical direction that is perpendicular to an upper surface of the underlying structure.

Methods for manufacturing an image sensor according to some embodiments of the present inventive concepts may include: preparing a substrate (e.g., a semiconductor substrate) including a pixel array unit, in which a plurality of pixels is positioned, and a peripheral area around the pixel array unit, and depositing a first insulating layer and a second insulating layer, which have different layer qualities (e.g., properties), on a first surface of the substrate; etching the first insulating layer and the second insulating layer by a first etching method to form a first opening of the first and second insulating layers extending along an area around the pixel array unit; additionally etching a portion of the first insulating layer and the second insulating layer around the first opening by using a second etching method to form a second opening of the first insulating layer, and a third opening, which is larger than the second opening, of the second insulating layer; and depositing an organic photoelectric converting material on the substrate to form an organic photoelectric converting layer including a first portion positioned in the pixel array unit and a second portion positioned in the third opening, in which the second portion is separated from the first portion.

BRIEF DESCRIPTION OF THE DRAWINGS

FIGS. 3A, 3B, 3C, 3D, and 3E are cross-sectional views of the portion A of the image sensor illustrated in FIG. 2.

DETAILED DESCRIPTION OF THE EMBODIMENTS

As used herein the term "and/or" includes any and all combinations of one or more of the associated listed items. Like reference numbers refer to like elements throughout.

An image sensor 1 according to example embodiments will be described with reference to FIGS. 1 and 2. First, a structure of the image sensor 1 in plan view will be schematically described with reference to FIG. 1, and then a structure of a cross-section of the image sensor 1 will be described in detail with reference to FIG. 2.

Figure 1:
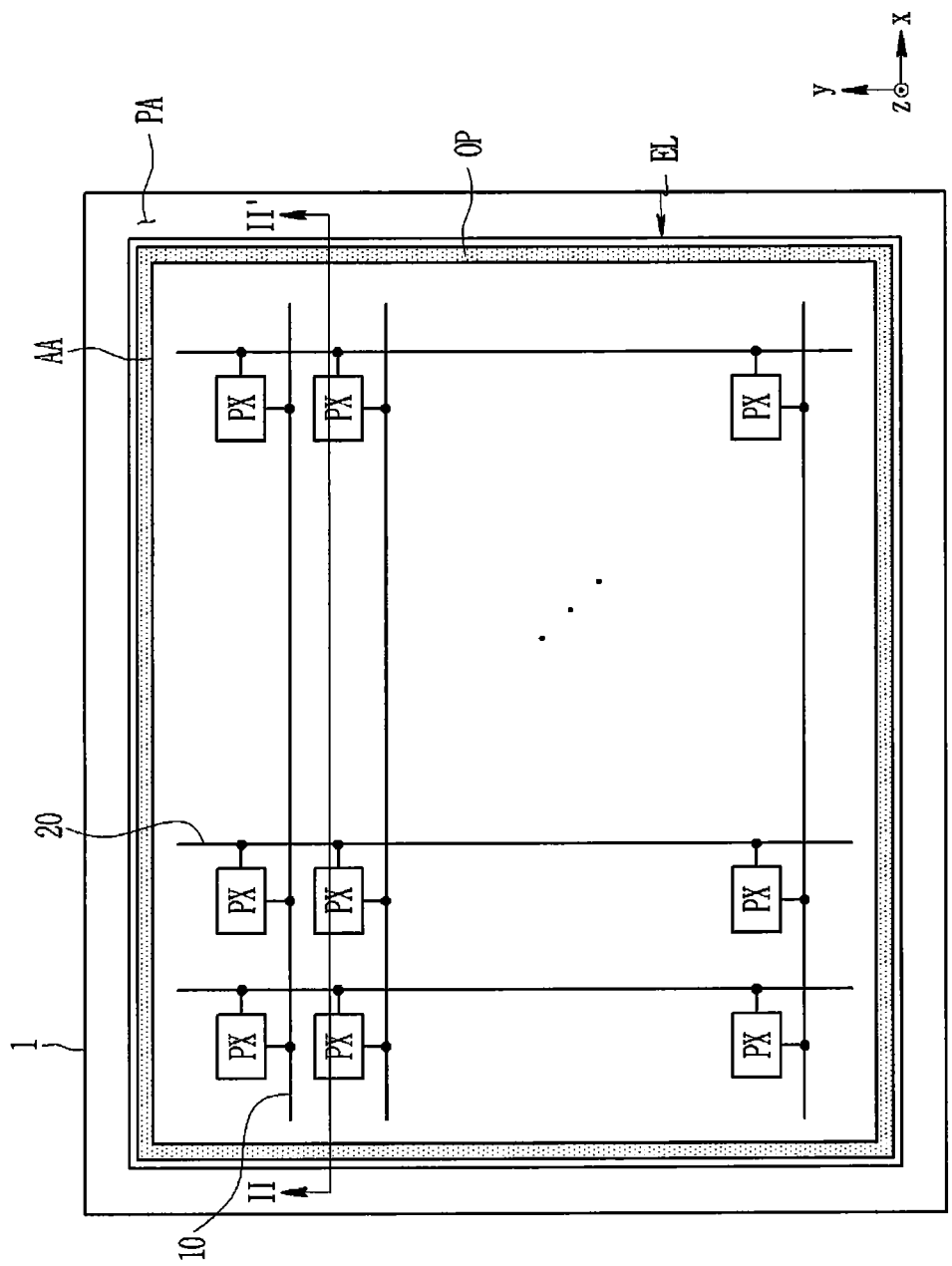
FIG. 1 is plan view of an image sensor according to example embodiments.
Figure 2:
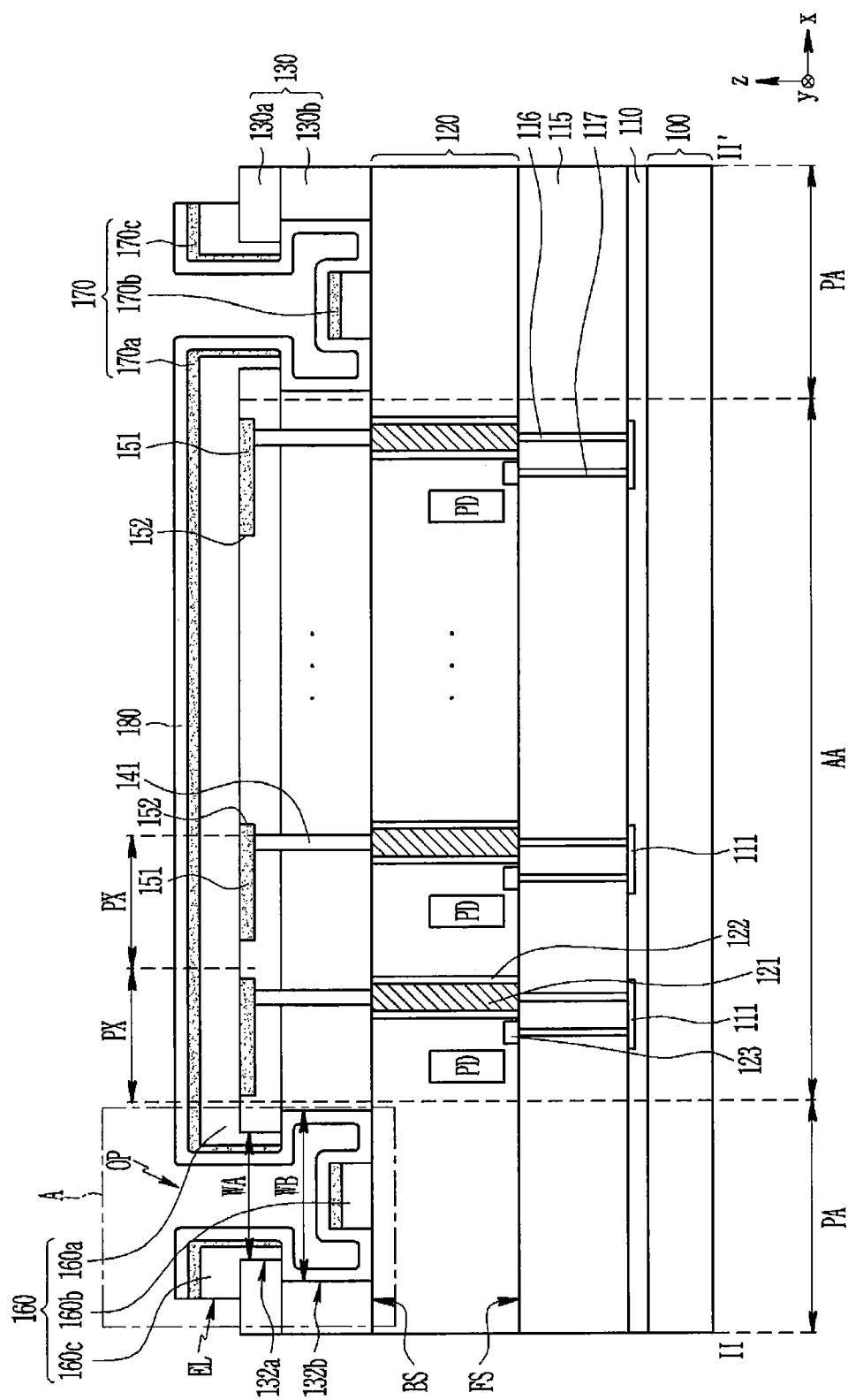
FIG. 2 is a cross-sectional view of the image sensor illustrated in FIG. 1 taken along the line II-II'.

FIG. 1 is plan view of an image sensor according to example embodiments, and FIG. 2 is a cross-sectional view of the image sensor illustrated in FIG. 1 taken along the line II-II'.

Referring to FIG. 1, the image sensor 1 includes a pixel array unit AA and a peripheral area PA adjacent the pixel array unit AA. In some embodiments, the peripheral area PA may surround the pixel array unit AA in plan view, as illustrated in FIG. 1. It will be understood that the pixel array unit AA refers to a pixel array area.

The pixel array unit AA includes a plurality of pixels PX and a plurality of signal lines 10 and 20. The plurality of pixels PX may be arranged in a form of a matrix, and each pixel PX includes at least one photoelectric converter. The plurality of signal lines 10 and 20 may include the plurality of first signal lines 10 extending in a first direction X, and the plurality of second signal lines 20 extending in a second direction Y traversing the first direction X. In some embodiments, the first direction X crosses the second direction Y and may be perpendicular to the second direction Y. The first signal line 10 may transmit a driving signal for driving the pixel PX and drive the pixel PX in the unit of a row. The second signal line 20 may transmit a pixel signal according to charges generated by the photoelectric converter of each pixel PX in response to light incident on each pixel PX. Each pixel PX may be connected to at least one first signal line 10 and one second signal line 20.

The peripheral area PA includes a trench portion OP extending along an outer side of the pixel array unit AA. The trench portion OP may be formed of an opening formed in a plurality of insulating layers (e.g., 130a and 130b in FIG. 2), which is to be described below. The trench portion OP may have a structure, which extends along the periphery of the pixel array unit AA and surrounds most of the pixel array unit AA. The inventive concepts, however, are not limited thereto. In some embodiments, the trench portion OP may not surround the pixel array unit AA. A width of the trench portion OP in the plan view may be, for example, about 0.5 μm to about 2 μm, but not limited thereto.

Referring to FIG. 2, the image sensor 1 may include a substrate 120 (e.g., a semiconductor substrate). The substrate 120 may be a substrate including, for example, silicon, germanium, silicon-germanium, a Group-VI compound semiconductor, and a Group-V compound semiconductor. The substrate 120 may be a silicon substrate including impurities having a first conductive type (for example, p-type). In some embodiments, the impurities may be injected into the substrate 120 by, for example, an implantation process.

The substrate 120 may include a plurality of photoelectric converters PD, a plurality of conductive plugs 121, and a plurality of charge storing units 123.

The photoelectric converter PD may be an inorganic photoelectric converter, which is capable of photoelectrically converting incident light and generating charges. Examples of the photoelectric converter PD may include a photodiode, a pinned photodiode, a photogate, and a phototransistor. When the photoelectric converter PD is formed of a photodiode, each photoelectric converter PD may be formed by a pn junction, and may generate a pair of electron and hole in response to incident light and generate charges. In some embodiments, the photoelectric converter PD may be formed by injecting impurities having a second conductive type (for example, n-type) that is opposite to the first conductive type of the impurities included in the substrate 120. In some embodiments, the photoelectric converter PD may be formed to include a plurality of doping areas.

Each photoelectric converter PD may receive light of a specific wavelength band (or a specific color) and photoelectrically convert the light. Each pixel PX may include one photoelectric converter PD as illustrated in FIG. 2. In some embodiments, each pixel PX may include a plurality of photoelectric converters. When each pixel PX includes one photoelectric converter PD, the adjacent pixel PX may photoelectrically convert light of different wavelength bands. For example, when one pixel PX includes the photoelectric converter PD, which receives blue light and photoelectrically converts the blue light, the adjacent pixel PX may include the photoelectric converter PD, which receives red light and photoelectrically converts the red light.

The conductive plug 121 may transmit charges, which are photoelectrically converted in an organic photoelectric converter (e.g., an organic photoelectric converting layer 160), which is to be described below, and may extend through the substrate 120. An insulating layer 122 for possibly preventing a short-circuit with the substrate 120 may be positioned around the conductive plug 121. The insulating layer 122 may include, for example, an inorganic insulating material, such as a silicon oxide (SiOx) and a silicon nitride (SiNx).

One or more insulating layers 115 and one or more wiring layers 110 may be disposed on a first surface FS of the substrate 120. The one or more insulating layers 115 may be between the substrate 120 and the wiring layer 110.

The wiring layer 110 may include a plurality of pixel transistors for reading the charges generated in the photoelectric converter PD as a pixel signal, one or more wires including connection wires 111, and one or more interlayer insulating layer.

The insulating layer 115 may include a pair of conductive connecting units 116 and 117 positioned at each pixel PX. The conductive connecting units 116 and 117 may include, for example, a metal material, such as tungsten (W), aluminum (Al), copper (Cu). Each of the conductive connecting units 116 and 117 may extend through the insulating layer 115 in a thickness direction of the insulating layer 115 (e.g., a vertical direction that is perpendicular to a surface of the substrate 120). One end of the conductive connecting unit 116 may be connected to the conductive plug 121 of the substrate 120, and the other end of the conductive connecting unit 116 may be connected to the connection wire 111. One end of the conductive connecting unit 117 may be connected to the charge storing unit 123 of the substrate 120, and the other end of the conductive connecting unit 117 may be connected to the connection wire 111. Accordingly, the charge storing unit 123 may be connected to the conductive plug 121 through the conductive connecting units 116 and 117 of the insulating layer 115 and the connection wire 111 of the wiring layer 110. The charge storing unit 123 may include a semiconductor area having the second conductive type (for example, n-type). The charge storing unit 123 may temporarily store the charges photoelectrically converted in the organic photoelectric converter until the charges are read out.

The plurality of insulating layers 130 is positioned on a second surface BS of the substrate 120 that is opposite the first surface FS of the substrate 120. The plurality of insulating layers 130 may include an insulating material, such as a silicon oxide (SiOx), a silicon nitride (SiNx), a hafnium oxide (HfOx), and an aluminum oxide ($Al_2O_3$). All of the plurality of insulating layers 130 may include the same material. In some embodiments, the plurality of insulating layers 130 may include two or more layers including different materials.

The plurality of insulating layers 130 may include a first insulating layer 130a (i.e., an upper insulating layer) and a second insulating layer 130b (i.e., a lower insulating layer) which have different layer qualities (e.g. different properties). In some embodiments, the second insulating layer 130b is between the first insulating layer 130a and the substrate 120 as illustrated in FIG. 2. For example, a density of the first insulating layer 130a may be greater than a density of the second insulating layer 130b. Further, the first insulating layer 130a and the second insulating layer 130b may be etched at different etching speeds/rates by a specific etching process. Particularly, the first insulating layer 130a and the second insulating layer 130b may be etched at different speeds when the first insulating layer 130a and the second insulating layer 130b are etched by the same wet etching process, and the first insulating layer 130a may be etched slower than the second insulating layer 130b.

The first insulating layer 130a and the second insulating layer 130b may include the same material or different materials. The first insulating layer 130a and the second insulating layer 130b having different layer qualities may be formed by depositing the same insulating material under different deposition process conditions or may be formed by depositing different insulating materials.

When the first insulating layer 130a and the second insulating layer 130b are adjacent to each other as illustrated, a boundary (e.g., an interface) between the first insulating layer 130a and the second insulating layer 130b may be visible or invisible. Further, each of the first insulating layer 130a and the second insulating layer 130b may also be formed of a single layer as illustrated or may include a plurality of layers.

Still referring to FIGS. 1 and 2, the first insulating layer 130a may include a first opening 132a (i.e., an upper portion of the trench portion OP), and the second insulating layer 130b may include a second opening 132b (i.e., a lower portion of the trench portion OP). The first opening 132a and the second opening 132b may overlap each other in plan view and may be connected in a vertical direction to form the trench portion OP. The first and second openings 132a and 132b may extend along an area adjacent an outer side of the pixel array unit AA in the plan view and may surround most of the pixel array unit AA. It will be understood that the substrate 120 can be considered as an underlying structure under the first insulating layer 130a and the second insulating layer 130b, and the first and second openings 132a and 132b may expose a portion of the substrate 120.

As illustrated in FIG. 2, a size of the first opening 132a of the first insulating layer 130a may be smaller than a size of the second opening 132b of the second insulating layer 130b, and sides of the first insulating layer 130a, which define the first opening 132a, may protrude from sides of the second insulating layer 130b, which define the second opening 132b. Accordingly, the second opening 132b may undercut the first insulating layer 130a. In some embodiments, the first opening 132a may have a first width WA in the first direction X, the second opening 132b may have a second width WB in the first direction X, and the first width WA is greater than the second width WB, as illustrated in FIG. 2. It will be understood that the first insulating layers 130a are spaced apart from each other in the first direction by a first distance (i.e., the first width WA), and the second insulating layers 130b are spaced apart from each other in the first direction by the second distance (i.e., the second width WB).

The second insulating layer 130b may also be completely removed under the second opening 132b of the second insulating layer 130b as illustrated in FIG. 2. In some embodiments, a portion of the second insulating layer 130b may remain under the second opening 132b, and the second opening 132b may not expose the substrate 120.

Although FIG. 2 shows that the first insulating layer 130a is the topmost layer of the plurality of insulating layers 130, it will be understood that the inventive concepts are not limited thereto. In some embodiments, several layers of the plurality of insulating layers 130 may be disposed on the first insulating layer 130a, and the first insulating layer 130a is disposed between the several layers of the plurality of insulating layers 130 and the substrate 120.

The topmost surface of the insulating layer 130 (e.g., the topmost surface of the first insulating layer 130a) may be flat. The topmost surface of the insulating layer 130, in some embodiments, may include a plurality of recesses 152 on the plurality of pixels PX, respectively, as illustrated in FIG. 2 and may not be flat.

The plurality of lower electrodes 151 may be positioned on the insulating layer 130. The plurality of lower electrodes 151 may be positioned so as to correspond to the plurality of pixels PX, respectively. The lower electrodes 151 may be positioned so as to correspond to the plurality of recesses 152 of the upper surface of the first insulating layer 130a, respectively. Each of the plurality of lower electrodes 151 may overlap a corresponding one of the plurality of pixels PX and may overlap a corresponding one of the plurality of recesses 152 in plan view. Upper surfaces of the lower electrodes 151 and an upper surface of the first insulating layer 130a may form a flat surface. In some embodiments, the upper surfaces of the lower electrodes 151 and an upper surface of the first insulating layer 130a may be coplanar as illustrated in FIG. 2.

In some embodiments, the plurality of color filters (not illustrated) may be disposed in the insulating layer 130. Further, a reflection preventing layer (not illustrated) may be disposed between the color filter and the substrate 120.

The organic photoelectric converting layer 160 may be on the insulating layer 130 and the lower electrode 151 and in the trench portion OP. The organic photoelectric converting layer 160 may include a first portion 160a, which is continuously formed on the pixel array unit AA and is disposed on the insulating layer 130, a second portion 160b, which is in the trench portion OP, and a third portion 160c, which is on the peripheral area PA adjacent an outer side of the trench portion OP and is disposed on the insulating layer 130.

The second portion 160b of the organic photoelectric converting layer 160 is separated from the first portion 160a of the organic photoelectric converting layer 160, and the organic photoelectric converting layer 160 may not be disposed on a lateral surface of the second opening 132b of the second insulating layer 130b. That is, the second portion 160b is physically separated from the first portion 160a and is spaced apart from the first portion 160a with an interval. The first portion 160a may be spaced apart from the second portion 160b in a third direction Z, and a lower surface of the first portion 160a may be higher than a lower surface of the second portion 160b relative to the upper surface of the substrate 120, as illustrated in FIG. 2. The lower surface of the first portion 160a may directly contact the first insulating layer 130a and the lower surface of the second portion 160b may directly contact the substrate 120 (i.e., underlying structure).

Most of the first portion 160a may be disposed on the pixel array unit AA, and a portion of the first portion 160a may be disposed on the peripheral area PA adjacent to the pixel array unit AA. In some embodiments, a portion of the first portion 160a disposed on a lateral surface of the first opening 132a (i.e., a side of the first insulating layer 130a) may be on the peripheral area PA, as illustrated in FIG. 2. In some embodiments, each of the lower electrodes 151 is disposed outside of a region between the second portion 160b of the organic photoelectric converting layer 160 and the substrate 120, as illustrated in FIG. 2. In some embodiments, the second portion 160b of the organic photoelectric converting layer 160 may directly contact the substrate 120.

The second portion 160b may extend along the trench portion OP in plan view and may have substantially the same shape as the aforementioned shape of the trench portion OP in plan view. That is, the second portion 160b may extend along the periphery of the pixel array unit AA in plan view, and, in some embodiments, the second portion 160b may surround the pixel array unit AA.

In some embodiments, an edge of the second portion 160b may be aligned with an edge of the first portion 160a in plan view, and an opposing edge of the second portion 160b may be aligned with an edge of the third portion 160c in plan view. Most of the second portion 160b may be disposed between the first portion 160a and the third portion 160c in plan view, as illustrated in FIG. 2.

The first portion 160a and the third portion 160c may be spaced apart from each other with the trench portion OP interposed therebetween. Each of the first portion 160a and the third portion 160c may include a portion on a lateral surface of the first insulating layer 130a, which define the first opening 132a of the trench portion OP, and a thickness of this portion (i.e., a thickness in the first direction X) may be smaller than a thickness of a portion (i.e., a thickness of the third direction Z) on the upper surface of the first insulating layer 130a. It will be understood that an upper surface of an element refer to a surface substantially parallel to the upper surface of the substrate 120, and the element also include a lower surface opposite the upper surface and a lateral surface extending between the upper surface and the lower surface. Unlike the illustration, in some embodiments, the organic photoelectric converting layer 160 may not be disposed on the lateral surface of the first insulating layer 130a defining the first opening 132a of the first insulating layer 130a.

The third portion 160c includes a lateral surface defining a part of an outer boundary surface EL outside of the pixel array unit AA. The organic photoelectric converting layer 160 may be removed from and thus may not be present outside of the outer boundary surface EL on the peripheral area PA. Referring again to FIG. 1, the outer boundary surface EL may be on the peripheral area PA, may extend along the periphery of the pixel array unit AA, and, in some embodiments, may surround the pixel array unit AA. The outer boundary surface EL may also extend along the outer periphery of the trench portion OP as illustrated in FIG. 1. In some embodiments, the outer boundary surface EL may extend while overlapping the trench portion OP. Referring again to FIG. 2, the outer boundary surface EL may be substantially vertical to the upper surface of the substrate 120 in the cross-sectional view.

The organic photoelectric converting layer 160 may include an organic photoelectric converting material. The organic photoelectric converting layer 160 may be formed of a single layer as illustrated or may include a plurality of organic material layers. Particularly, the organic photoelectric converting layer 160 may include a p-type semiconductor compound and an n-type semiconductor compound to form a pn junction, may receive incident light and generate excitons, and may separate the generated excitons into holes and electrons.

The organic photoelectric converting layer 160 may photoelectrically convert light of a specific wavelength band (or a specific color). For example, the organic photoelectric converting layer 160 may photoelectrically convert light of a green color, and in this case, the organic photoelectric converting layer 160 may include a rhodamine-based pigment, a nerocyanine-based pigment, quinacridone, and/or the like. In addition, the organic photoelectric converting layer 160 may also photoelectrically convert light of a red color or a blue color, and/or infrared rays.

The difference in the etching speeds of the first insulating layer 130a and the second insulating layer 130b may have the degree, in which the trench portion OP may have an appropriate size in plan view, and the first and second insulating layers 130a and 130b have an appropriate undercut structure. Here, the appropriate undercut structure of the first and second insulating layers 130a and 130b may have the degree, in which the first portion 160a, the second portion 160b, and the third portion 160c of the organic photoelectric converting layer 160 may be separately formed from one another when the organic photoelectric converting layer 160 is deposited during a process for manufacturing the image sensor 1.

An upper electrode 170 is positioned on the organic photoelectric converting layer 160. The organic photoelectric converting layer 160 is positioned between the lower electrode 151 and the upper electrode 170 in each pixel PX. The upper electrode 170 may include a fourth portion 170a, which is continuously formed on the pixel array unit AA and is disposed on the first portion 160a of the organic photoelectric converting layer 160, a fifth portion 170b, which is disposed in the trench portion OP and is disposed on the second portion 160b of the organic photoelectric converting layer 160, and a sixth portion 170c, which is disposed on the peripheral area PA at the external side of the trench portion OP and is disposed on the third portion 160c of the organic photoelectric converting layer 160.

In some embodiments, an edge of the sixth portion 170b may be aligned with an edge of the fifth portion 170a in plan view, and an opposing edge of the sixth portion 170b may be aligned with an edge of the seventh portion 170c in plan view. Most of the fifth portion 170b may be disposed between the fourth portion 170a and the sixth portion 170c in plan view, as illustrated in FIG. 2.

The fourth portion 170a and the sixth portion 170c may be spaced apart from each other with the trench portion OP interposed therebetween. The fourth portion 170a and the sixth portion 170c may further include a portion on a lateral surface the organic photoelectric converting layer 160 defining the trench portion OP, and a thickness (i.e., a thickness in the first direction X) of this portion may be smaller than a thickness (i.e., a thickness in the third direction Z) of a portion on the upper surface of the organic photoelectric converting layer 160. Unlike the illustration, the upper electrode 170 may not be disposed on the lateral surface of the organic photoelectric converting layer 160 defining the trench portion OP.

The sixth portion 170c includes a lateral surface defining a part of the outer boundary surface EL. The upper electrode 170 may be removed and thus may not be present outside of the outer boundary surface EL on the peripheral area PA.

The lower electrode 151 and the upper electrode 170 may include, for example, a transparent conductive material, such as an Indium tin oxide (ITO) and an Indium zinc oxide (IZO).

The organic photoelectric converting layer 160, the lower electrode 151, and the upper electrode 170 in each pixel PX, collectively, form one organic photoelectric converter. The lower electrode 151 may be connected with the conductive plug 121 of the substrate 120 through the conductive connecting unit 141 extending through the insulating layer 130 in the thickness direction (i.e., the third direction Z). The conductive connecting unit 141 may include, for example, a metal material, such as tungsten (W), aluminum (Al), copper (Cu). The charges, which are photoelectrically converted and generated in the organic photoelectric converter, may be collected in the charge storing unit 123 through the conductive connecting unit 141, the conductive plug 121, the conductive connecting units 116 and 117, and the conductive wire 111.

In some embodiments, one pixel PX of the image sensor may include a plurality of the organic photoelectric converters, which overlaps one another. In this case, another lower electrode, another organic photoelectric converting layer, and another upper electrode, which may be formed of, respectively, the lower electrode 151, the organic photoelectric converting layer 160, and the upper electrode 170, may be additionally deposited on the organic photoelectric converter to form another organic photoelectric converter. When one organic photoelectric converter positioned in one pixel PX photoelectrically converts light of a first wavelength band (or a first color) and reads a signal, another organic photoelectric converter of the same pixel PX may photoelectrically convert light of a second wavelength band (or a second color) different from the first wavelength band and read a signal. Further, when at least one organic photoelectric converter is positioned in one pixel PX and at least one photoelectric converter (e.g., inorganic photoelectric converter) is in the substrate 120, the photoelectric converters may photoelectrically convert light of different wavelength bands and may read signals, respectively.

A passivation layer 180 is positioned on the upper electrode 170. The passivation layer 180 may protect the organic photoelectric converter form an external material, and compensate for stress applied to the organic photoelectric converter.

The passivation layer 180 may be continuously formed on an entirety of the substrate 120, including all of the pixel array unit AA, the peripheral area PA, and the trench portion OP. The passivation layer 180 may extend from the pixel array unit AA into the peripheral area PA. The passivation layer 180 in the trench portion OP may include a portion on a lateral surface of the upper electrode 170, a portion on an exposed bottom surface of the first insulating layer 130a, a portion on a lateral surface of the second insulating layer 130b defining the second opening 132b, a portion on an exposed upper surface of the substrate 120 in the trench portion OP, a portion on the lateral surface of the second portion 160b of the organic photoelectric converting layer 160, and a lateral surface and an upper surface of the fifth portion 170b of the upper electrode 170, and the like.

A thickness of the passivation layer 180 may be substantially uniform.

The passivation layer 180 may include a lateral surface defining a part of the outer boundary surface EL. The passivation layer 180 may be removed and thus may not be present outside of the outer boundary surface EL on the peripheral area PA.

As illustrated in FIG. 2, the organic photoelectric converting layer 160, the upper electrode 170, and the passivation layer 180 may have the outer lateral surfaces aligned with the outer boundary surface EL, and the organic photoelectric converting layer 160, the upper electrode 170, and the passivation layer 180 may be removed and may not be present outside of the outer boundary surface EL in plan view.

The passivation layer 180 may include, for example, an insulating material, such as a silicon oxide (SiOx), a silicon nitride (SiNx), silicon oxynitride (SiON), an aluminum oxide ($Al_2O_3$), and may be formed of a single layer or multiple layers (for example, $Al_2O_3$/SiON).

The lateral surfaces of the first and second insulating layers 130a and 130b in the trench portion OP and the lateral surfaces of the portions 160a, 160b, and 160c of the organic photoelectric converting layer 160 may be substantially perpendicular to the upper surface of the substrate 120, but the inventive concepts are not limited thereto.

In some embodiments, a lens layer (not illustrated) including multiple micro-lenses, each of which corresponds to each pixel PX, may be disposed on the passivation layer 180. Each micro-lens may collect incident light and may make the collected light be incident to the pixel PX. The lens layer may include, for example, a silicon oxynitride (SiON), and/or a resin-based material, such as styrene-based resin, acryl-based resin, styrene-acryl copolymer resin, and/or siloxane-based resin.

Still referring to FIG. 2, a circuit board 100 may be on a lower surface of the wiring layer 110. The circuit board 100 may include, for example, a driving circuit inputting a driving signal for driving the plurality of pixels PX, a signal processing circuit processing each pixel signal from the pixel PX, a timing control circuit, and the like. The circuit board 100 may be connected to the substrate 120 and the wiring layer 110 by various methods, such as a wafer to wafer bonding method and a wire bonding method.

When light is incident on an upper side (i.e., the second surface BS side of the substrate 120) of the image sensor 1, the light of the wavelength band (or the color, for example, the green color) detected by the organic photoelectric converter may be photoelectrically converted in the organic photoelectric converting layer 160 of the organic photoelectric converter, the charges may be stored in the charge storing unit 123 and then may be read out, and the light of other wavelength bands (or the color, for example, the red color or the blue color) may be photoelectrically converted in the photoelectric converter PD within the substrate 120 and may be read out.

Then, examples of various structures of the portion A of the image sensor 1 illustrated in FIG. 2 will be described with reference to FIGS. 3A, 3B, 3C, 3D, and 3E, together with FIGS. 1 and 2.

FIGS. 3A, 3B, 3C, 3D, and 3E are cross-sectional views illustrating various structures of the portion A of the image sensor illustrated in FIG. 2.

Referring to FIG. 3A, the lateral surfaces of the portions 160a, 160b, and 160c of the organic photoelectric converting layer 160 are not perpendicular to the upper surface of the substrate 120, but are oblique to form tapered forms.

A thickness of a portion of the upper electrode 170 on the lateral surface of the organic photoelectric converting layer 160 may be smaller than that of a portion of the upper electrode 170 on the upper surface (i.e., a surface substantially parallel to the upper surface of the substrate 120) of the organic photoelectric converting layer 160. That is, a thickness of the upper electrode 170 may be different according to locations. In some embodiments, the thickness of the upper electrode 170 may gradually decrease as the upper electrode 170 becomes closer to an edge of the organic photoelectric converting layer 160, as illustrated in FIG. 3A.

Next, referring to FIG. 3B, a structure around the trench portion OP may be substantially the same as that of FIG. 3A, but at least parts of the lateral surfaces of the first and second insulating layers 130a and 130b defining the first and second openings 132a and 132b of the trench portion OP may have curved surfaces, particularly, concave surfaces. Further, sizes of the first and second openings 132a and 132b may vary according to a height of a portion of the first and second openings 132a and 132b from the substrate 120. An area of the first opening 132a may increase along the third direction Z, and an area of the second opening 132b may increase along the third direction Z. That is, the lateral surfaces of the first and second insulating layers 130a and 130b may have the curved surfaces and the forms oblique to the upper surface of the substrate 120.

Next, referring to FIG. 3C, a structure around the trench portion OP may be substantially the same as that of FIG. 3B, but an area of the first opening 132a may be largest adjacent a center of the first insulating layer 130a in the third direction Z, and an area of the second opening 132b may be largest adjacent a center of the second insulating layer 130b in the third direction Z.

Next, referring to FIG. 3D, the trench portion OP may be formed up to an inner side of the substrate 120. A lower portion of the trench portion OP may be in the substrate 120. That is, the upper surface of the substrate 120 corresponding to the trench portion OP may form a recess portion 125, which is concave in a down direction and the second portion 160b of the organic photoelectric converting layer 160 and the fifth portion 170b of the upper electrode 170 may be positioned on the recess portion 125.

Next, FIG. 3E illustrates the example, in which the plurality of insulating layers 130 includes three layers. That is, the plurality of insulating layers 130 may include the first insulating layer 130a, the second insulating layer 130b, and a third insulating layer 130c. As described above, the first insulating layer 130a and the second insulating layer 130b may have different layer qualities (e.g. different properties), and the second insulating layer 130b and the third insulating layer 130c may also have different layer qualities (e.g. different properties). The first to third insulating layers 130a, 130b, and 130c may have different etching speeds. The first to third insulating layers 130a, 130b, and 130c may be etched at different rates by an etching process. In some embodiments, the insulating layer, which is farther from the substrate 120, among the plurality of insulating layers 130 may have a lower etching speed.

The first insulating layer 130a, the second insulating layer 130b, and the third insulating layer 130c include the first, second and third openings 132a, 132b, and 132c, respectively, and the first, second and third openings 132a, 132b, and 132c, collectively, form the trench portion OP. The first, second and third openings 132a, 132b, and 132c may overlap one another in plan view and may be connected in the vertical direction. A size of the first opening 132a (i.e., an upper portion of the trench portion OP) of the first insulating layer 130a may be smaller than a size of the second opening 132b of the second insulating layer 130b (i.e., a middle portion of the trench portion OP), and the size of the second opening 132b of the second insulating layer 130b may be smaller than a size of the third opening 132c (i.e., a lower portion of the trench portion OP) of the third insulating layer 130c. Accordingly, the lateral surfaces of the first to third insulating layers 130a, 130b, and 130c may form the plurality of undercut structures in the trench portion OP.

According to FIG. 3E, the undercut structure of the insulating layer 130 in the trench portion OP may ensure separation of the first portion 160a, the second portion 160b, and the third portion 160c of the organic photoelectric converting layer 160 when the organic photoelectric converting layer 160 is deposited.

Next, the image sensor 1 having a different structure according to example embodiments will be described with reference to FIGS. 4, 5A, and 5B.

Figure 4:
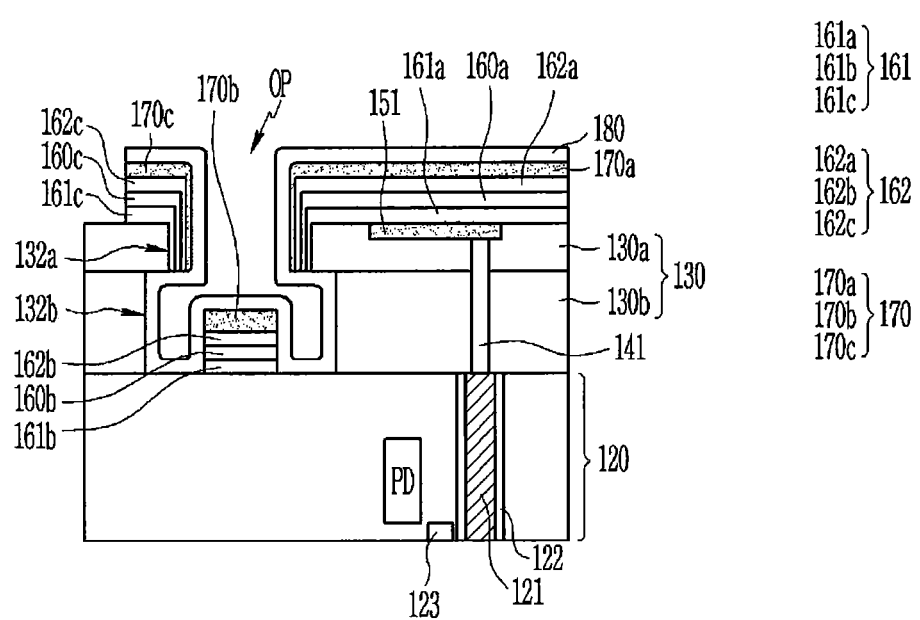
FIG. 4 is a cross-sectional view of the image sensor according to example embodiments including the portion A of the image sensor illustrated in FIG. 2.
Figure 5A:
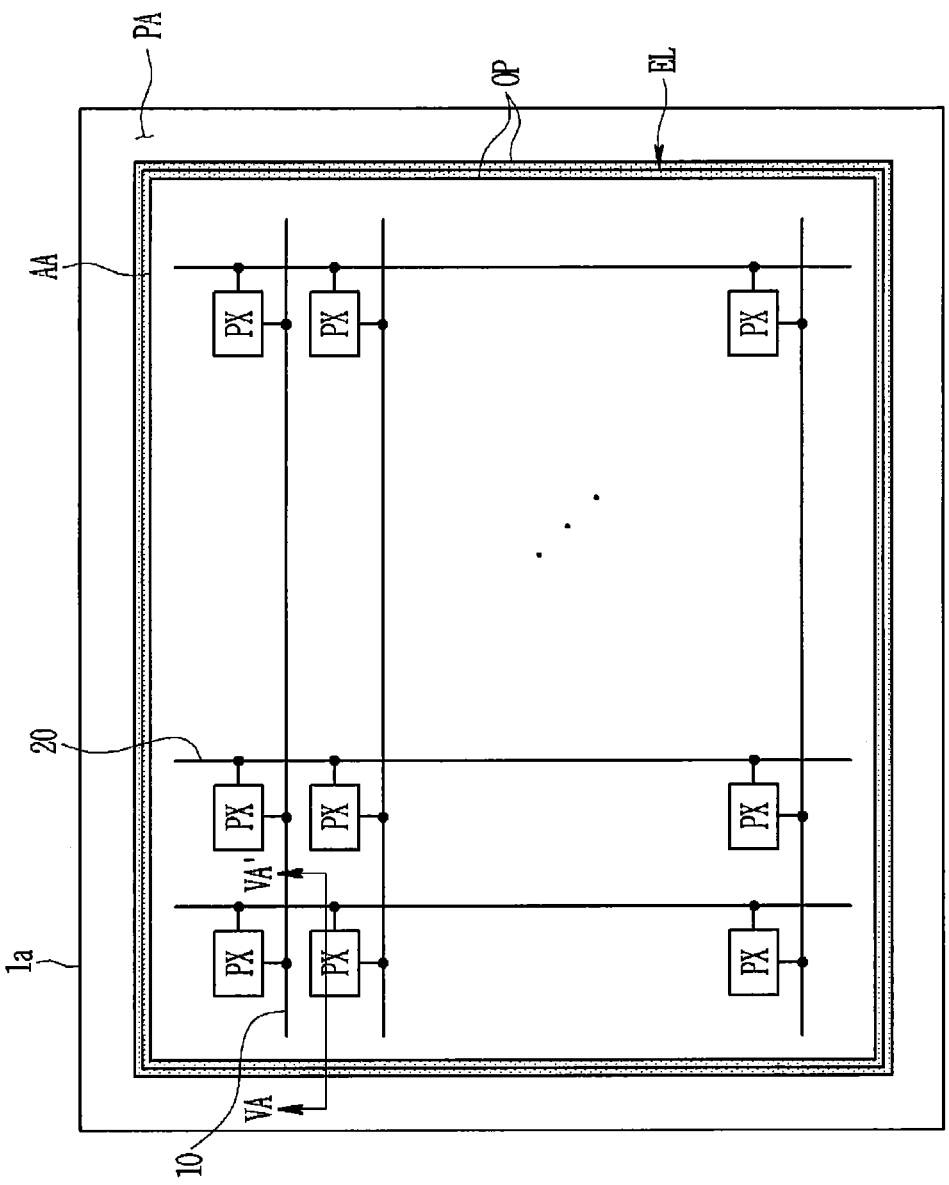
FIG. 5A is plan view of an image sensor according to example embodiments.
Figure 5B:
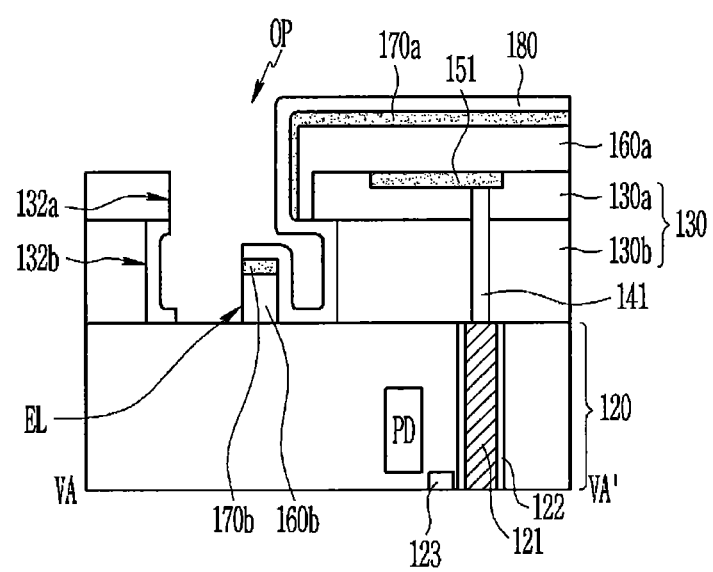
FIG. 5B is a cross-sectional view of the image sensor illustrated in FIG. 5A taken along line the VA-VA'.

FIG. 4 is a cross-sectional view of the image sensor 1 according to example embodiments, FIG. 5A is a plan view of an image sensor according to example embodiments, and FIG. 5B is a cross-sectional view of the image sensor illustrated in FIG. 5A taken along the line VA-VA'.

First, referring to FIG. 4, the image sensor 1 according to example embodiments may be substantially the same as the image sensors 1 discussed with reference to FIG. 2. The image sensor 1 of FIG. 4 may further include at least one of a first auxiliary layer 161 including portions 161a, 161b, and 161c between an organic photoelectric converting layer 160 and the lower electrode 151 or the first insulating layer 130a, and a second auxiliary layer 162 including portions 162a, 162b, and 162c between the organic photoelectric converting layer 160 and the upper electrode 170.

Each of the first auxiliary layer 161 and the second auxiliary layer 162 may include, for example, at least one selected from a hole injecting layer (HIL) for easily injecting holes, a hole transporting layer (HTL) for easily transporting holes, an electron blocking layer (EBL) for blocking a movement of electrons, an electron injecting layer (EIL) for easily injecting electrons, an electron transporting layer for easily transporting electrons (ETL), and a hole blocking layer (HBL) for blocking a movement of holes. For example, the first auxiliary layer 161 may be an electron blocking layer, and the second auxiliary layer 162 may be a hole blocking layer.

The first auxiliary layer 161 and the second auxiliary layer 162 may include, for example, an organic material, an inorganic material, and/or an organic-inorganic material.

In some embodiments, one of the first auxiliary layer 161 and the second auxiliary layer 162 may be omitted.

Next, referring to FIGS. 5A and 5B, an image sensor 1a according to example embodiments may be substantially the same as the image sensor 1 illustrated in FIGS. 1 and 2, but may be different in a position of an outer boundary surface EL in plan view. The outer boundary surface EL may overlap a trench portion OP in plan view. That is, the outer lateral surfaces of the organic photoelectric converting layer 160, the upper electrode 170, and a passivation layer 180 aligned in the outer boundary surface EL may be in the trench portion OP.

Referring to FIG. 5B, a second portion 160b of the organic photoelectric converting layer 160, a fifth portion 170b of the upper electrode 170, and the passivation layer 180 include lateral surfaces defining the outer boundary surface EL that is in the trench portion OP. That is, the organic photoelectric converting layer 160, the upper electrode 170, and the passivation layer 180 may be removed and may not be present outside of the outer boundary surface EL disposed in the trench portion OP. Accordingly, a third portion 160c of the organic photoelectric converting layer 160 and a sixth portion 170c of the upper electrode 170 in FIG. 2 may be omitted, and the lateral surface of the passivation layer 180 may be in the trench portion OP.

In some embodiments, a portion of the passivation layer 180 may be disposed on a lateral surface facing a left side of a second opening 132b of a second insulating layer 130b in the trench portion OP. However, as described above, the passivation layer 180 may not be outside of the outer boundary surface EL.

Now, a method of manufacturing an image sensor according to example embodiments will be described with reference to FIGS. 6 to 10 together with FIGS. 1 and 2. Herein, an operation of forming a lens layer (e.g., 190 in FIG. 11) which is not illustrated in FIG. 2 will also be described.

FIGS. 6 to 10 are cross-sectional views sequentially illustrating a manufacturing operation according to a method of manufacturing an image sensor according to example embodiments.

Figure 6:
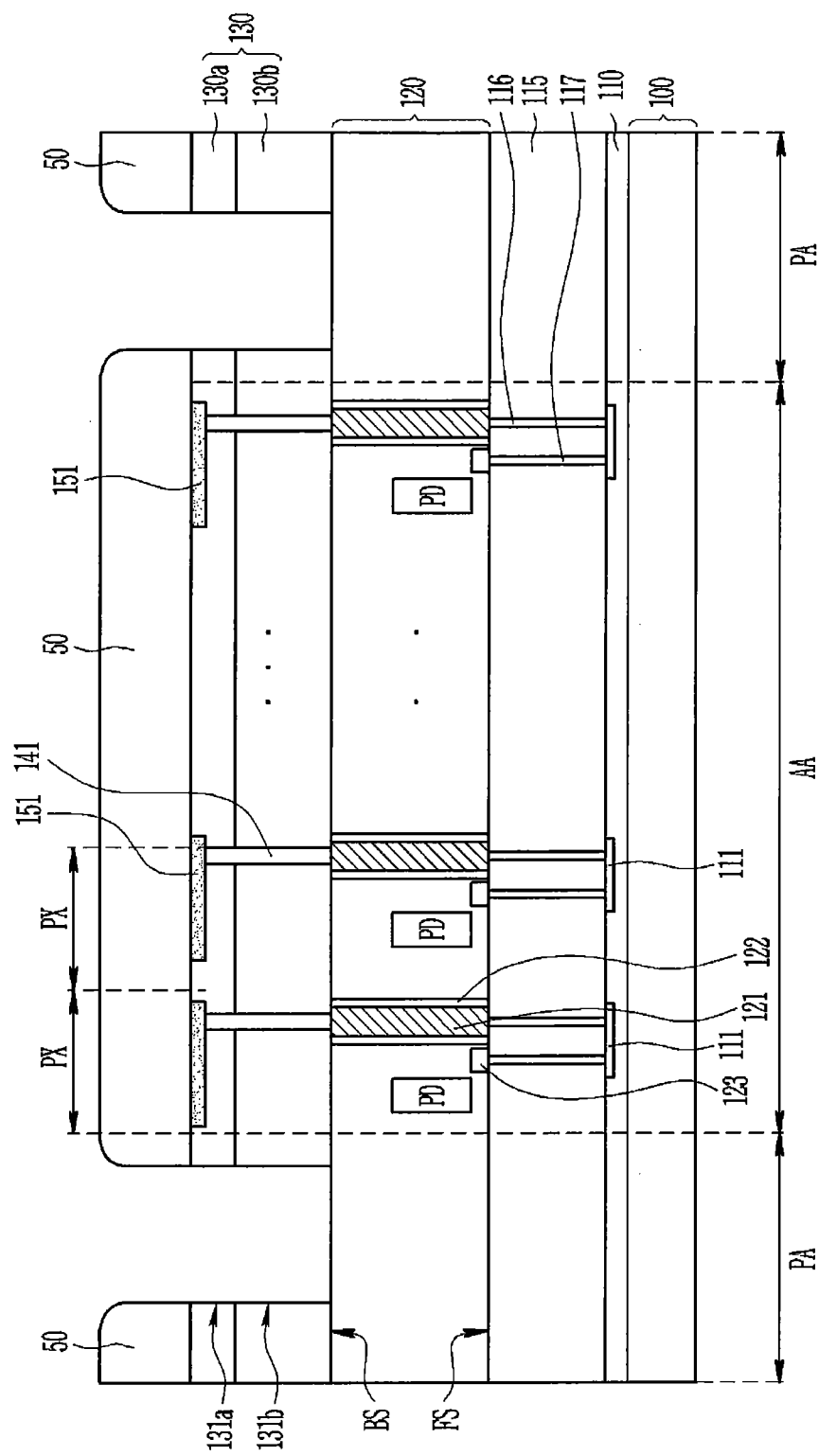
FIGS. 6, 7, 8, 9, and 10 are cross-sectional views illustrating a method of manufacturing an image sensor according to example embodiments.

First, referring to FIG. 6, a plurality of photoelectric converters PD, a plurality of conductive plugs 121, and a plurality of charge storing units 123 are formed in a substrate 120. The operation may be performed on a first surface FS of the substrate 120. Next, an insulating layer 115 is deposited on the first surface FS of the substrate 120 and then conductive connecting units 116 and 117 are formed, and a plurality of pixel transistors, one or more wires including a connection wire 111, and a wiring layer 110 including one or more interlayer insulating layers are formed on the insulating layer 115.

Next, a circuit board 100 may be bonded onto the wiring layer 110 (a lower surface of the wiring layer 110 in FIG. 6). However, the bonding operation of the circuit board 100 may also be performed later.

The substrate 120 may be reversed so that a second surface BS that is opposite the first surface FS heads a front side. One end of the conductive plug 121 may be exposed by removing a portion of the substrate 120 at the second surface BS side by a predetermined thickness by using a process, such as chemical mechanical polishing (CMP).

Next, the plurality of insulating layers 130 including a first insulating layer 130a and a second insulating layer 130b is sequentially deposited on the second surface BS of the substrate 120 exposing the conductive plug 121. The first insulating layer 130a and the second insulating layer 130b may be formed by sequentially depositing different insulating materials by using a chemical vapor deposition (CVD) process and the like, or may be formed to have different layer qualities (e.g., properties) by depositing the same insulating material under different deposition conditions.

For example, the second insulating layer 130b may be formed on the second surface BS of the substrate 120 by using a tetraethylorthosilicate (TEOS) CVD process and the like, and then the first insulating layer 130, which is denser than the second insulating layer 130b, may be formed by using a high density plasma (HDP) CVD process and the like. The first insulating layer 130a and the second insulating layer 130b formed as described above may include an insulating material, such as a silicon oxide (SiOx), a silicon nitride (SiNx), a hafnium oxide (HfOx), and an aluminum oxide ($Al_2O_3$).

Next, a plurality of openings is formed by patterning the first and second insulating layers 130a and 130b by using a photolithography process, and then conductive connecting units 141, which extend through the insulating layer 130 in the third direction Z, is formed by depositing, patterning, and polishing a conductive (e.g., metal) material, such as tungsten (W), aluminum (Al), and copper (Cu).

Next, a plurality of lower electrodes 151 is formed by depositing a transparent conductive material, such as an ITO and an IZO, on the first insulating layer 130a, and pattering the transparent conductive material by using a photolithography process and the like. Next, an insulating material (for example, the same material as that of the first insulating layer 130a) may be deposited on the lower electrodes 151 and the first insulating layer 130a, and then an upper surface of the first insulating layer 130a may be polished by a CMP method and the like until upper surfaces of the lower electrodes 151 and an upper surface of the first insulating layer 130a may form a flat surface together. In some embodiments, upper surfaces of the lower electrodes 151 and the first insulating layer 130a may be coplanar.

Next, first and second preliminary openings 131a and 131b are formed by patterning the insulating layer 130 along the outer periphery of the pixel array unit AA by using a photolithography process and the like. A photoresist 50 patterned by the photolithography process may be formed on the insulating layer 130, and the insulating layer 130 may be etched by using a first etching method. The first etching method may be an anisotropic etching method, such as a dry etching. According to the first etching method, as illustrated in FIG. 6, a lateral surface of the first preliminary opening 131a of the first insulating layer 130a and a lateral surface of the second preliminary opening 131b of the second insulating layer 130b may be vertically aligned and may be substantially perpendicular to an upper surface of the substrate 120 to form one vertical surface.

Figure 7:
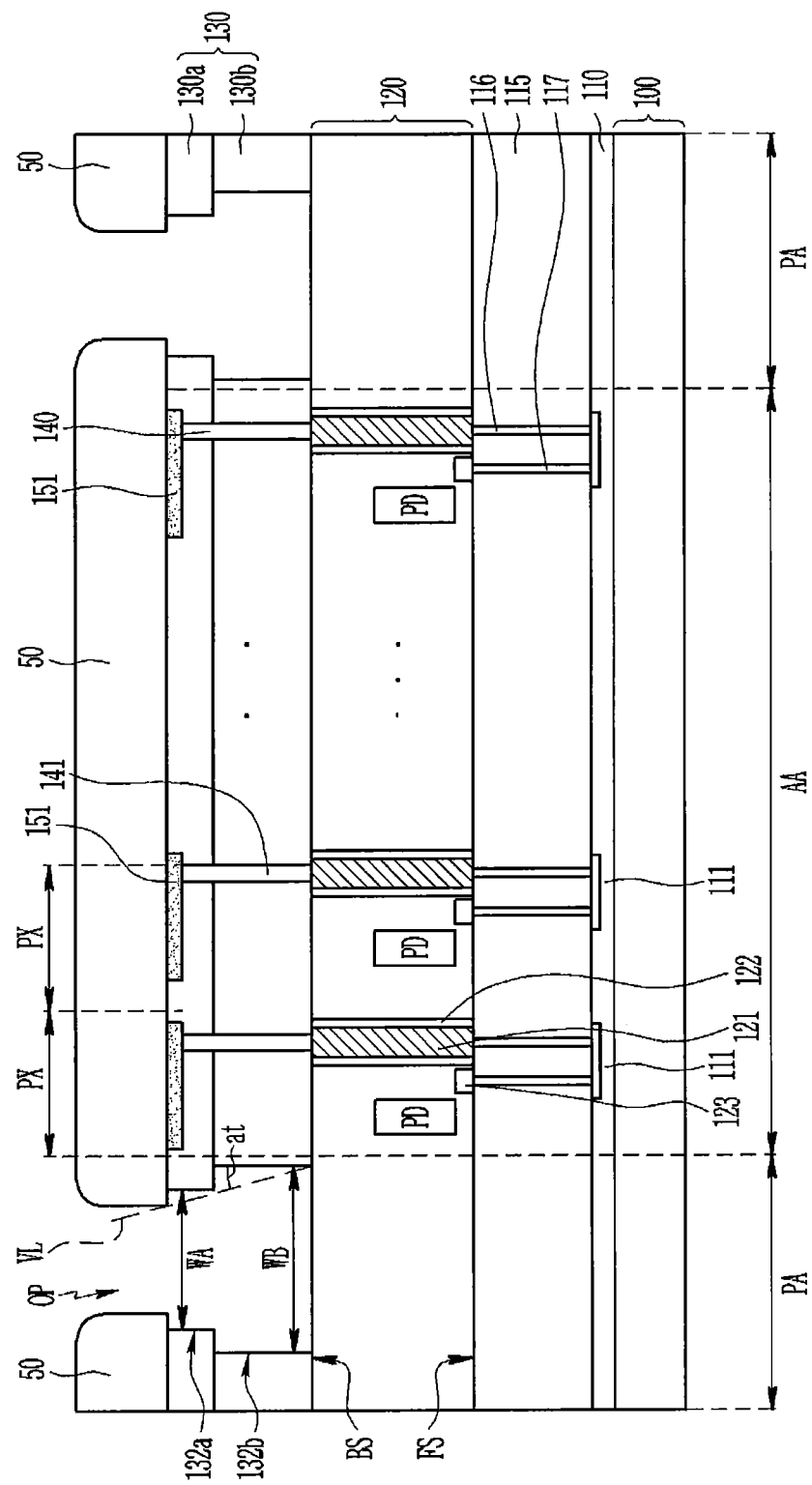

Next, referring to FIG. 7, portions of the first and second insulating layers 130a and 130b around the first and second preliminary openings 131a and 131b are additionally etched by using a second etching method. The second etching method may have higher isotropy than that of the first etching method, and may be, for example, a wet etching method. During the second etching method, a wet etching speed of the second insulating layer 130b is higher than a wet etching speed of the first insulating layer 130a, so that the second insulating layer 130b is more rapidly etched and thus an undercut structure is formed in the first insulating layer 130a and the second insulating layer 130b as illustrated in FIG. 7. Accordingly, an first opening 132a having a first width WA in the first direction X is formed in the first insulating layer 130a and an second opening 132b having a second width WB in the first direction X is formed in the second insulating layer 130b to form a trench portion OP. The second width WB may be greater than the first width WA. The second width WB may be, for example, about 0.5 μm to about 2 μm, but not limited thereto.

As illustrated in FIG. 7, when a virtual straight line VL, which is in contact with a lateral surface of the first insulating layer 130a, is drawn from a bottom end of a lateral surface of the second insulating layer 130b, an angle at between the virtual straight line VL and a line vertical to the upper surface of the substrate 120 may be, for example, about 20° or more, but not limited thereto. The degree of undercut in the first and second openings 132a and 132b of the first and second insulating layers 130a and 130b may be appropriately adjusted to the degree, in which the portion of the organic photoelectric converting layer 160 positioned on the first insulating layer 130a is separable from the portion of the organic photoelectric converting layer 160 positioned inside the second opening 132b when the organic photoelectric converting layer 160 is deposited by a subsequent process.

Figure 8:
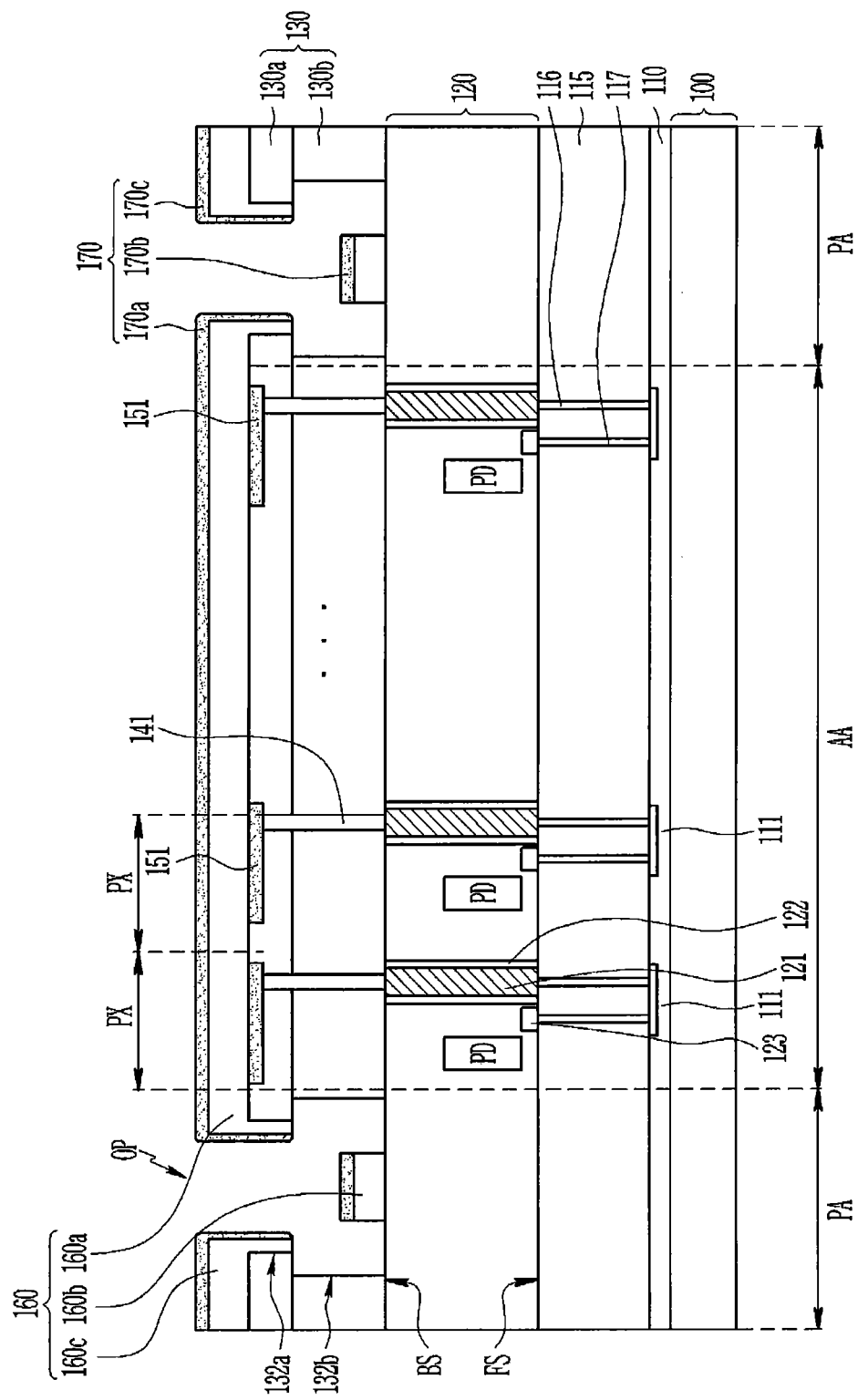

Next, referring to FIG. 8, the organic photoelectric converting layer 160 is formed by depositing an organic photoelectric converting material on the entire surface of the substrate 120 by using a first depositing method. The first depositing method may be an anisotropy depositing method, such as a physical vapor deposition (PVD) process. According to the first depositing method, the organic photoelectric converting layer 160 is not formed on the lateral surface of the second opening 132b of the second insulating layer 130b and the organic photoelectric converting layer 160 is formed so as to include separated first portion 160a, second portion 160b, and third portion 160c by the undercut structures of the first and second openings 132a and 132b of the first and second insulating layers 130a and 130b. The first portion 160a and the third portion 160c are positioned on the first insulating layer 130a while being spaced apart from each other, and the second portion 160b is positioned in the trench portion OP. Accordingly, the first portion 160a of the organic photoelectric converting layer 160 positioned in the pixel array unit AA may be physically separated from the second portion 160b and the third portion 160c of the organic photoelectric converting layer 160 positioned in a peripheral area PA.

Next, an upper electrode 170 is formed by depositing a transparent conductive material, such as an ITO and an IZO, on the organic photoelectric converting layer 160 by using the anisotropy depositing method (the first depositing method), such as a PVD process. According to the first depositing method, the upper electrode 170 is not formed on the lateral surface of the second opening 132b of the second insulating layer 130b and the upper electrode 170 is formed so as to include separated fourth portion 170a, fifth portion 170b, and sixth portion 170c by the undercut structures of the first and second openings 132a and 132b of the first and second insulating layers 130a and 130b. The fourth portion 170a and the sixth portion 170c are positioned on the organic photoelectric converting layer 160 while being spaced apart from each other, and the fifth portion 170b is positioned in the trench portion OP.

Figure 9:
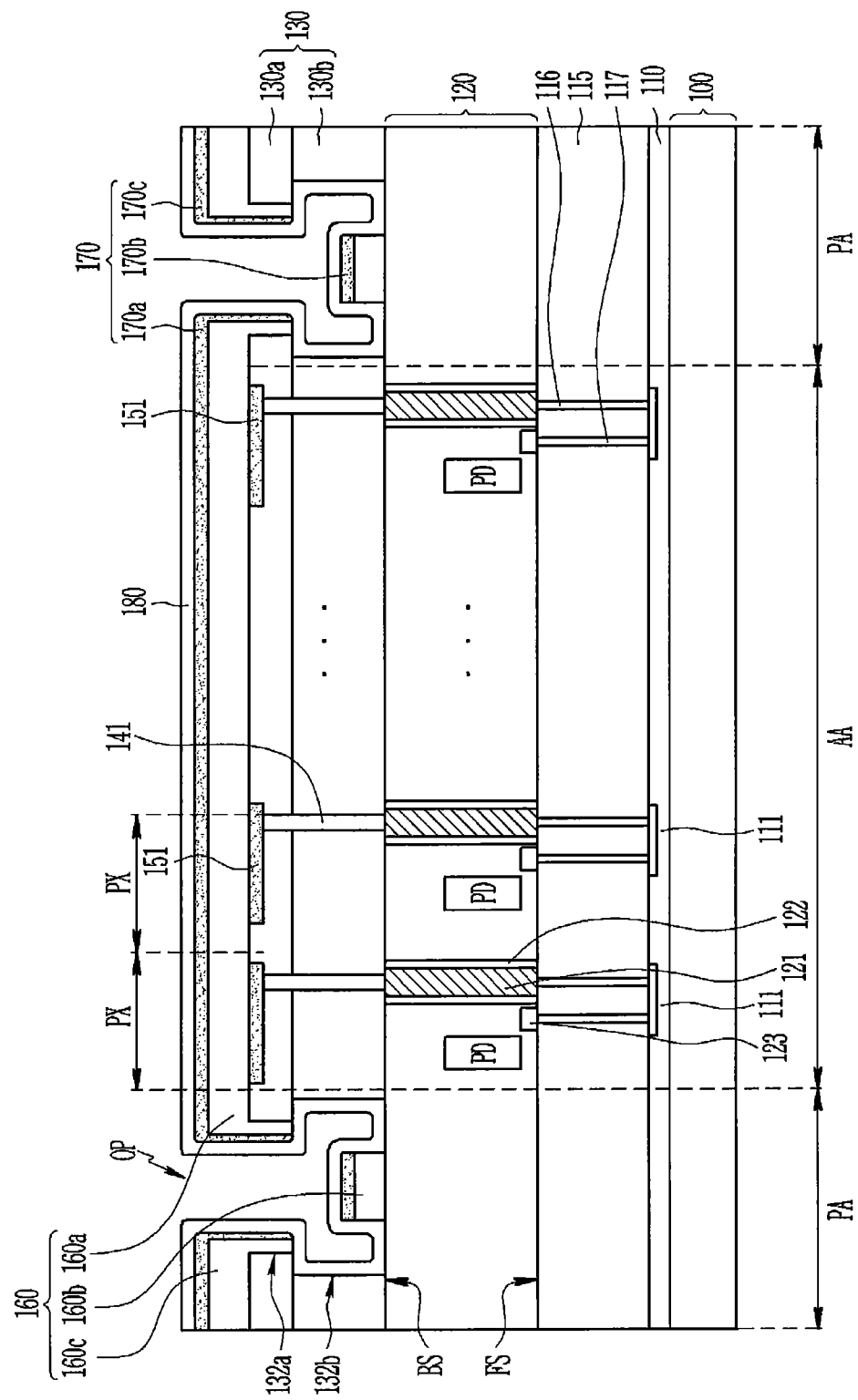

Next, referring to FIG. 9, a passivation layer 180 is formed by depositing, for example, an insulating material, such as a silicon oxide (SiOx), a silicon nitride (SiNx), a silicon oxynitride (SiON), an aluminum oxide ($Al_2O_3$), on the entire surface of the substrate 120 by using a second depositing method. The second depositing method is a depositing method having higher isotropy than that of the first depositing method, and may be, for example, a chemical vapor deposition (CVD) process.

The passivation layer 180 may also be formed on the lateral surface of the second opening 132b of the second insulating layer 130b, so that the passivation layer 180 may be continuously formed with a substantially uniform thickness.

Figure 10:
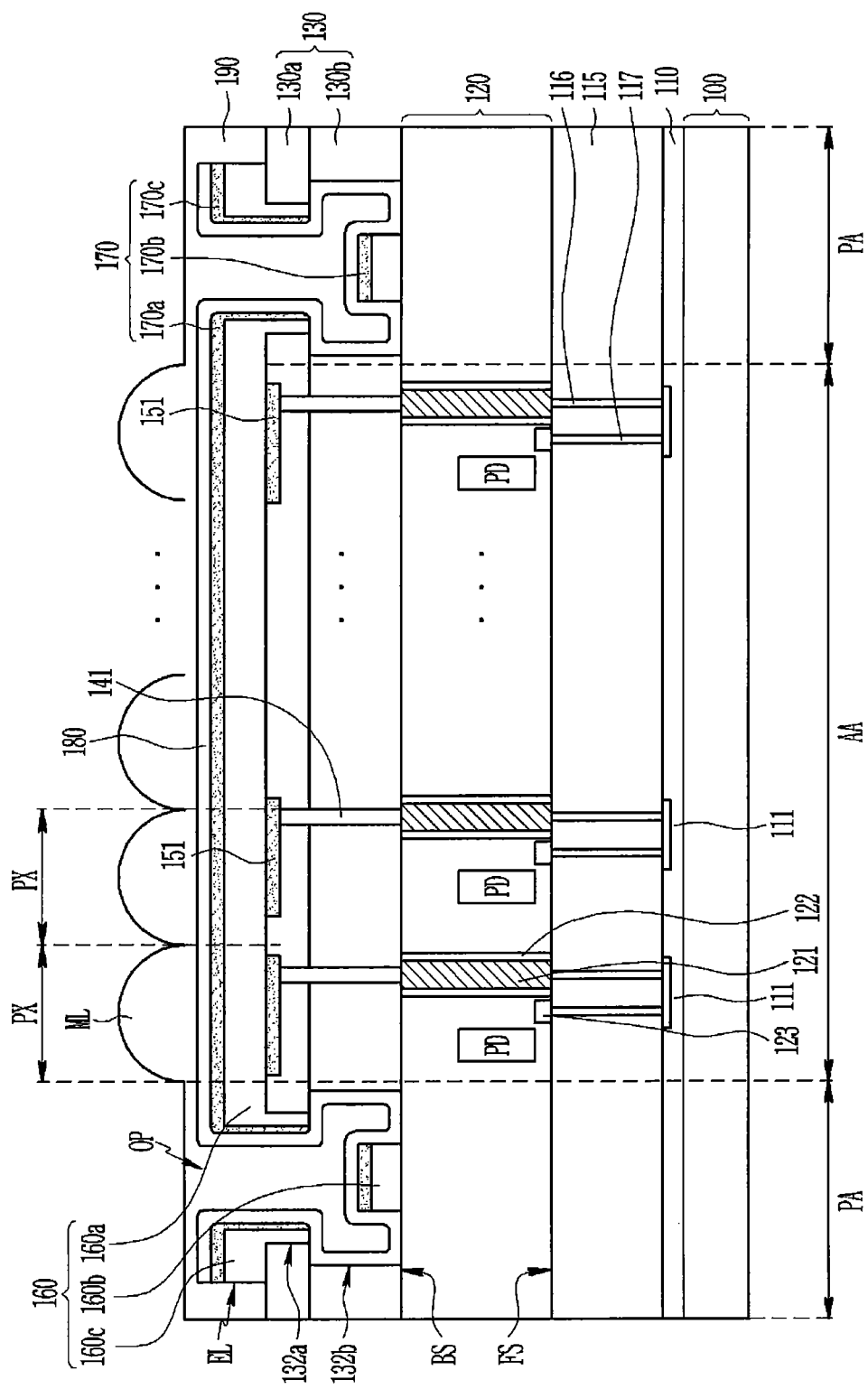

Next, referring to FIG. 10, a portion positioned at the external side of the pixel array unit AA (a portion positioned at an external side of an outer boundary surface EL) is removed by patterning the organic photoelectric converting layer 160, the upper electrode 170, and the passivation layer 180. Portions of the organic photoelectric converting layer 160, the upper electrode 170, and the passivation layer 180 outside the outer boundary surface EL may be removed. The patterning method may use, for example, a photolithography process, and a etching process (e.g., a dry etching process using plasma), but is the patterning method is not limited thereto. According to the patterning method, the organic photoelectric converting layer 160, the upper electrode 170, and the passivation layer 180 are left only at an inside of the outer boundary surface EL, and the organic photoelectric converting layer 160, the upper electrode 170, and the passivation layer 180 include the lateral surfaces defining the outer boundary surface EL. The outer boundary surface EL may also be positioned in the peripheral area PA at the external side of the trench portion OP as illustrated in FIG. 10, and may also be positioned in an area overlapping the trench portion OP.

As appreciated by the inventors, the organic photoelectric converting layer 160 may be easily affected by oxygen, moisture, an etchant, and the like, so that when the organic photoelectric converting layer 160 is exposed to those, a characteristic of the organic photoelectric converter may be degraded. According to example embodiments of the present inventive concepts, the second portion 160b or the third portion 160c of the organic photoelectric converting layer 160, which are exposed to the etchant and the like, is physically separated from the first portion 160a on the pixel array unit AA, so that the first portion 160a of the organic photoelectric converting layer 160 on the pixel array unit AA may not be exposed to oxygen, moisture, the etchant, and the like and may not affected. Therefore, properties of the organic photoelectric converter may not be changed or degraded. Further, the etching process is performed in the state where the passivation layer 180 completely covers the first portion 160a of the organic photoelectric converting layer 160 on the pixel array unit AA, so that the organic photoelectric converting layer 160 on the pixel array unit AA may not be damaged.

Further, patterning the organic photoelectric converting layer 160, the upper electrode 170, and the passivation layer 180 may use a conventional photolithography process, so that additional process for protecting the organic photoelectric converting layer 160 may not be necessary. Therefore, additional costs and process time may not be required, and there may be no concern about the complexity of the manufacturing process. Further, it may be possible to etch and pattern the organic photoelectric converting layer 160, the upper electrode 170, and the passivation layer 180 at one time, so that the manufacturing process may be simplified and the manufacturing time may decrease.

Subsequently, a material of the lens, such as a resin-based material, may be deposited on the entire surface of the substrate 120 by using, for example, a spin coating method and the like, a photoresist (not illustrated) shaped like a micro-lens may be formed on the material, and then a lens layer 190 including micro-lenses ML positioned on corresponding pixels PX may be formed by, for example, an etch back process.

Next, an image sensor according to example embodiments will be described with reference to FIG. 11 together with the aforementioned drawings.

Figure 11:
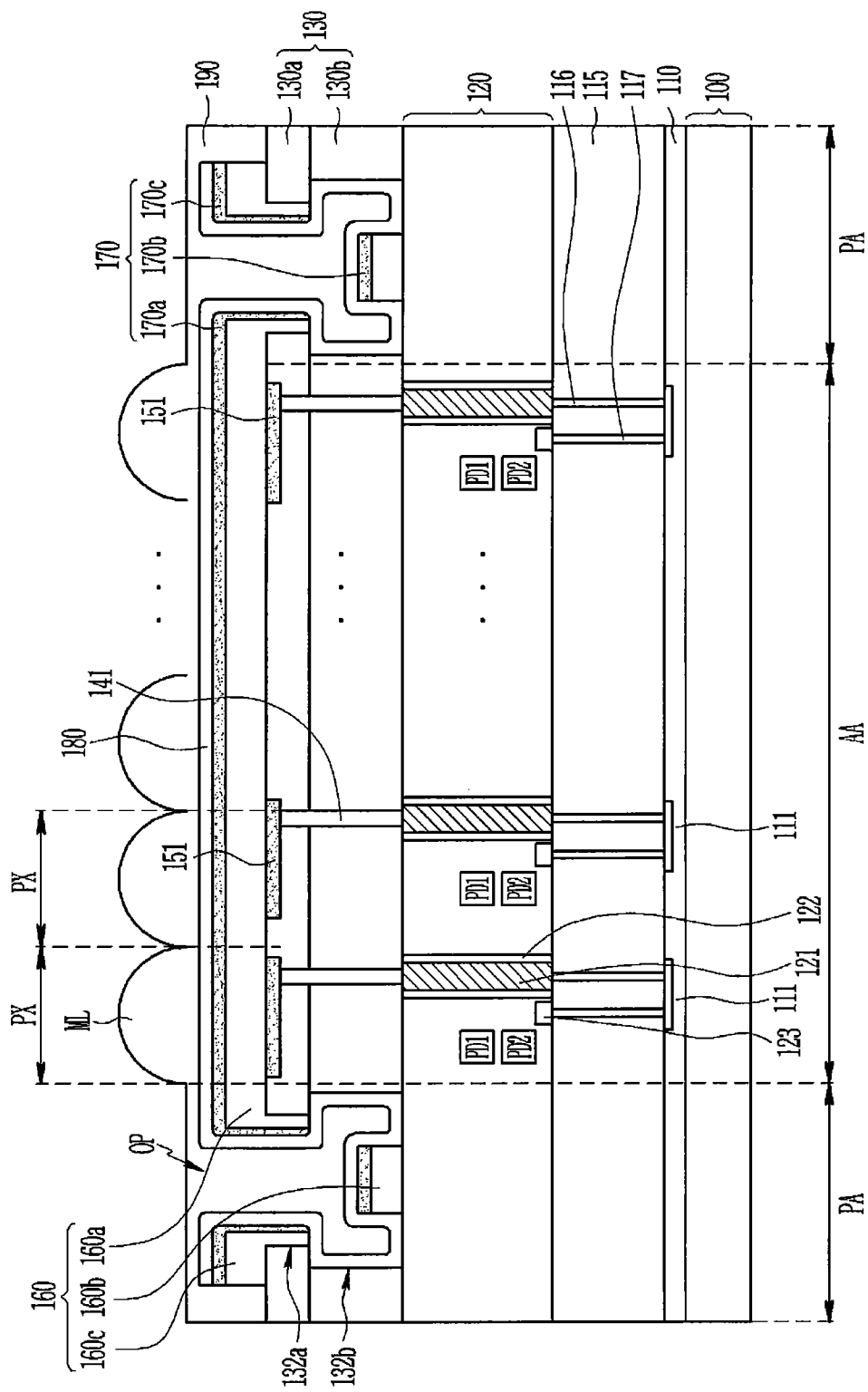
FIG. 11 is a cross-sectional view of an image sensor according to example embodiments.

FIG. 11 is a cross-sectional view of an image sensor according to example embodiments.

Referring to FIG. 11, an image sensor 1 according to example embodiments may be substantially the same as the image sensor illustrated in FIGS. 2 and 10, but each pixel PX may include a plurality of photoelectric converters PD1 and PD2 in a substrate 120. FIG. 11 illustrates an example, in which each pixel PX includes two photoelectric converters PD1 and PD2. The photoelectric converters PD1 and PD2 may receive light of different wavelength bands (or different colors) and photoelectrically convert the light. For example, the photoelectric converter PD1 may receive blue light and photoelectrically convert the received blue light, and the photoelectric converter PD2 may receive red light and photoelectrically convert the received red light.

The plurality of photoelectric converters PD1 and PD2 in each pixel PX may be overlap each other in a vertical direction as illustrated in FIG. 11. In some embodiments, the plurality of photoelectric converters PD1 and PD2 may not overlap and may be positioned in different areas in plan view.

Next, an image sensor according to example embodiments will be described with reference to FIGS. 12 and 13 together with the aforementioned drawings.

Figure 12:
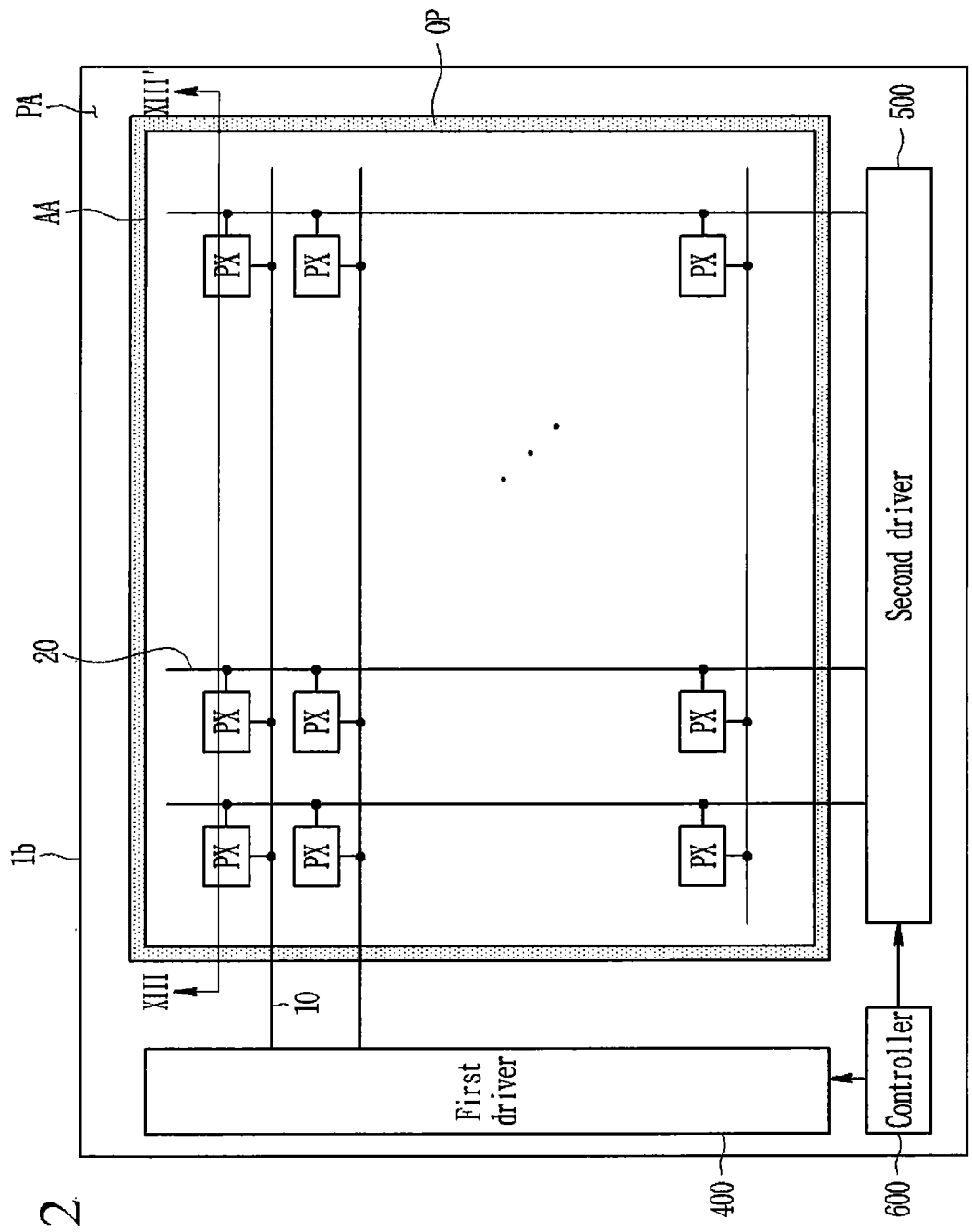
FIG. 12 is plan view of an image sensor according to example embodiments.
Figure 13:
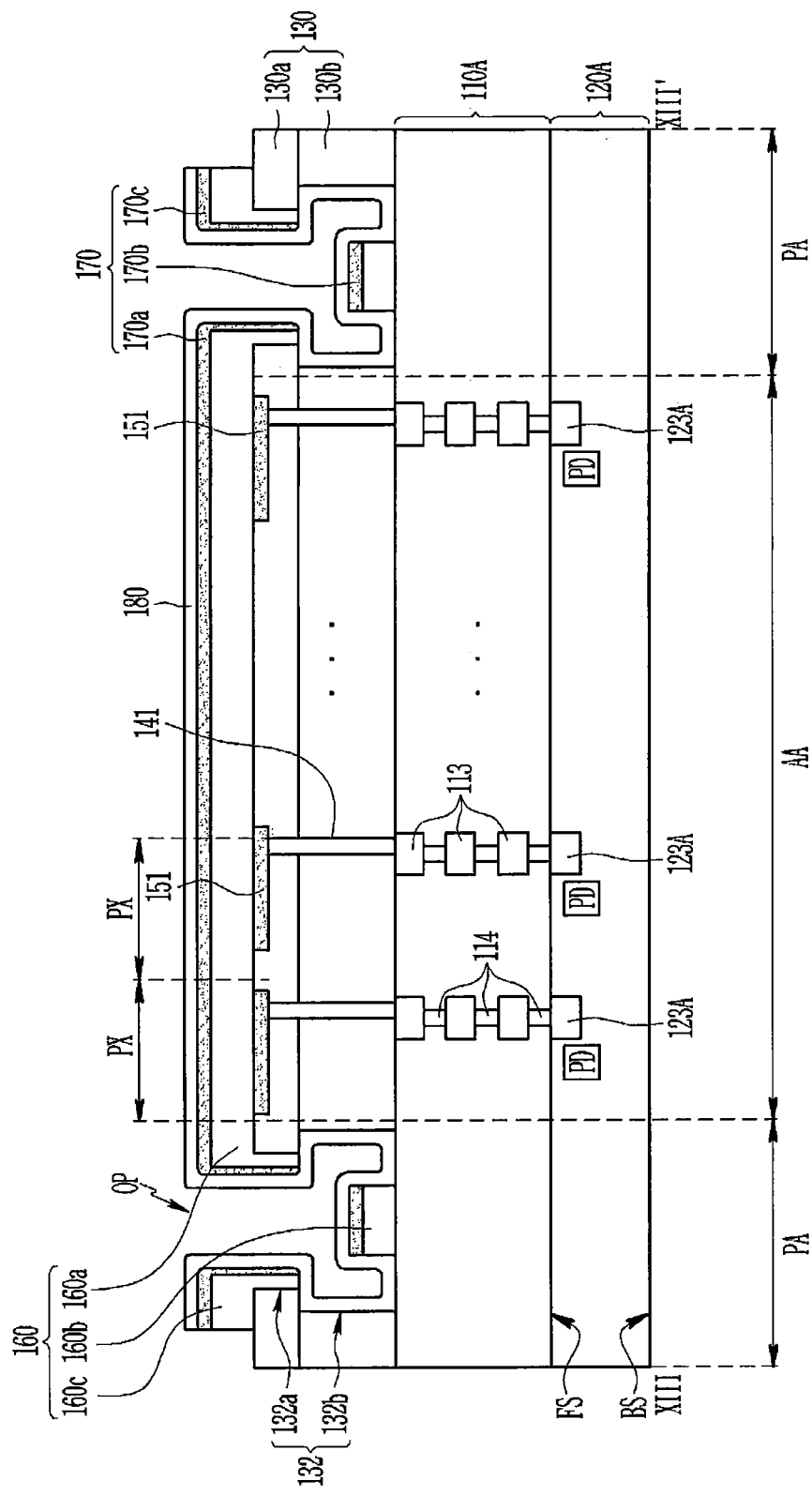
FIG. 13 is a cross-sectional view of the image sensor illustrated in FIG. 12 taken along the line XIII-XIII'.

FIG. 12 is a plan view of an image sensor according to example embodiments, and FIG. 13 is a cross-sectional view of the image sensor illustrated in FIG. 12 taken along the line XIII-XIII'.

Referring to FIG. 12, an image sensor 1b according to example embodiments may be substantially the same as the image sensor 1 illustrated in FIGS. 1 and 2, but the image sensor 1b may further include a driving circuit, such as a first driver 400, a second driver 500, and a controller 600 positioned in the peripheral area PA.

The first driver 400 may be connected with a plurality of first signal lines 10 and transmit a driving signal for driving a pixel PX to the first signal lines 10.

The second driver 500, which is a signal processing circuit, may be connected with a plurality of second signal lines 20, and may receive and process a pixel signal according to charges, which are generated according to the amount of light received by a photoelectric converter of each pixel PX, and generate image data.

The controller 600 may provide a timing signal and a control signal to the first driver 400 and the second driver 500 and control the operations of the first driver 400 and the second driver 500.

Referring to FIG. 13, a structure of a cross-section of the image sensor 1b may be substantially the same as that discussed above, so that differences will be mainly described.

The image sensor 1b may include a substrate 120A (e.g., a semiconductor substrate), and the substrate 120A may include a plurality of photoelectric converters PD and a plurality of charge storing units 123A.

A wiring layer 110A may be positioned on a first surface FS of the substrate 120A. The wiring layer 110A may include a plurality of pixel transistors for reading charges generated in the photoelectric converter PD as a pixel signal or a plurality of conductive layers for forming several wires, and one or more interlayer insulating layers, and may include a driving circuit, such as a first driver 400, a second driver 500, and a controller 600, which are described above.

The wiring layer 110A may include a plurality of conductive layers 113, which is vertically and sequentially connected in each pixel PX and extends through the wiring layer 110A, and one or more conductive connecting units 114. The conductive layers 113 and the conductive connection units 114 may be alternately disposed in each pixel PX, and may transmit the charges photoelectrically converted in an organic photoelectric converter to the charge storing unit 123A of the substrate 120A.

A plurality of insulating layers 130, a plurality of lower electrodes 151, an organic photoelectric converting layer 160, an upper electrode 170, and a passivation layer 180 may be sequentially positioned on the wiring layer 110A. It will be understood that the wiring layer 110A can be considered as an underlying layer under the plurality of insulating layers 130, and the first and second openings 132a and 132b may expose a portion of the wiring layer 110A.

The image sensors according to example embodiments may be applied to various electronic devices, such as a mobile phone, a digital camera, a camcorder, a robot, and a biosensor.

The above-disclosed subject matter is to be considered illustrative, and not restrictive, and the appended claims are intended to cover all such modifications, enhancements, and other embodiments, which fall within the true spirit and scope of the inventive concepts. Thus, to the maximum extent allowed by law, the scope is to be determined by the broadest permissible interpretation of the following claims and their equivalents, and shall not be restricted or limited by the foregoing detailed description.

What is claimed is:

1. An image sensor comprising:
   a semiconductor substrate;
   a pixel array area, in which a plurality of pixels are disposed;
   a peripheral area adjacent the pixel array area;
   an organic photoelectric converting layer including a first portion on the pixel array area and a second portion on the peripheral area, wherein the second portion is physically spaced apart from the first portion; and
   a plurality of insulating layers between the semiconductor substrate and the organic photoelectric converting layer, the plurality of insulating layers comprising a first insulating layer on the pixel array area and a second insulating layer on the peripheral area,
   wherein the first insulating layer and the second insulating layer define a trench therebetween, and
   wherein the trench is in the peripheral area, and
   wherein at least a portion of the second portion of organic photoelectric converting layer is on the peripheral area outside of the trench.

2. The image sensor of claim 1, further comprising:
   a plurality of lower electrodes between the semiconductor substrate and the first portion of the organic photoelectric converting layer; and
   an upper electrode on the organic photoelectric converting layer,
   wherein each of the plurality of lower electrodes is outside of a region between the semiconductor substrate and the second portion of the organic photoelectric converting layer.

3. The image sensor of claim 2, further comprising a passivation layer on the upper electrode,
   wherein the passivation layer extends from the pixel array area into the peripheral area.

4. The image sensor of claim 1,
   wherein the plurality of insulating layers include, respectively, upper insulating layers and include, respectively, lower insulating layers that are between the upper insulating layers and the semiconductor substrate and comprise a material having a property different from a property of the upper insulating layers, and wherein a lower portion of the trench defined by the lower insulating layers of the first insulating layer and the second insulating layer undercuts the upper insulating layers of the first insulating layer and the second insulating layer.

5. The image sensor of claim 4, wherein the first insulating layer and the second insulating layer are spaced apart from each other in a horizontal direction, and wherein the lower insulating layers of the first insulating layer and the second insulating layer are spaced apart from each other in the horizontal direction by a first distance, the upper insulating layers of the first insulating layer and the second insulating layer are spaced apart from each other in the horizontal direction by a second distance that is less than the first distance.

6. The image sensor of claim 1, further comprising:

a plurality of lower electrodes between the semiconductor substrate and the first portion of the organic photoelectric converting layer, wherein the trench does not overlap the plurality of lower electrodes in a vertical direction perpendicular to the semiconductor substrate.

7. An image sensor comprising:

an underlying structure comprising a pixel array area and a peripheral area adjacent the pixel array area, the pixel array area comprising a plurality of pixels;

an insulating layer on the pixel array area, the insulating layer exposing a portion of the peripheral area; and a first organic photoelectric converting layer on the insulating layer on the pixel array area and a second organic photoelectric converting layer on the portion of the peripheral area, the insulating layer and the first organic photoelectric converting layer being sequentially stacked on the underlying structure in a vertical direction, and the first organic photoelectric converting layer being spaced apart from and physically separated from the second organic photoelectric converting layer in the vertical direction, wherein the first organic photoelectric converting layer is non-overlapping of the second organic photoelectric converting layer in the vertical direction.

8. The image sensor of claim 7, wherein a lower surface of the first organic photoelectric converting layer is higher than a lower surface of the second organic photoelectric converting layer relative to an upper surface of the underlying structure.

9. The image sensor of claim 7, wherein a lower surface of the first organic photoelectric converting layer directly contacts the insulating layer, and wherein a lower surface of the second organic photoelectric converting layer directly contacts the underlying structure.

10. The image sensor of claim 7, wherein the insulating layer on the pixel array area comprises a first insulating layer, wherein the image sensor further comprises a second insulating layer on the peripheral area, wherein the first insulating layer and the second insulating layer are spaced apart from each other in a horizontal direction and define a recess therebetween, and wherein the second organic photoelectric converting layer is in the recess.

11. The image sensor of claim 10, wherein the recess comprises a lower portion adjacent the underlying structure and an upper portion farther from the underlying structure, and wherein the lower portion has a first width in the horizontal direction, the upper portion has a second width in the horizontal direction, and the first width is greater than the second width.

12. The image sensor of claim 11, wherein the first insulating layer and the second insulating layer comprise, respectively, upper insulating layers and comprise, respectively, lower insulating layers that are between the upper insulating layers and the underlying structure, and wherein the lower insulating layers of the first insulating layer and the second insulating layer define the lower portion of the recess, and the upper insulating layers of the first insulating layer and the second insulating layer define the upper portion of the recess.

13. The image sensor of claim 12, wherein sides of the upper insulating layers of the first insulating layer and the second insulating layer protrude from sides of the lower insulating layers of the first insulating layer and the second insulating layer, and the lower portion of the recess undercuts the upper insulating layers of the first insulating layer and the second insulating layer.

14. The image sensor of claim 12, wherein the lower insulating layers comprise a material having an etch rate different from an etch rate of the upper insulating layers.

15. An image sensor comprising:

an underlying structure comprising a pixel array area and a peripheral area adjacent the pixel array area, the pixel array area comprising a plurality of pixels;

a first insulating layer on the pixel array area and a second insulating layer on the peripheral area, the first insulating layer and the second insulating layer being spaced apart from each other in a horizontal direction and defining a trench therebetween in the peripheral area; and a first organic photoelectric converting layer on the first insulating layer on the pixel array area and a second organic photoelectric converting layer in the trench of the peripheral area, the first organic photoelectric converting layer being spaced apart from the second organic photoelectric converting layer in a vertical direction that is perpendicular to an upper surface of the underlying structure.

16. The image sensor of claim 15, wherein the trench comprises a lower portion adjacent the underlying structure and an upper portion farther from the underlying structure, and wherein the lower portion has a first width in the horizontal direction, the upper portion has a second width in the horizontal direction, and the first width is greater than the second width.

17. The image sensor of claim 16, wherein the first insulating layer and the second insulating layer comprise, respectively, upper insulating layers and comprise, respectively, lower insulating layers that are between the upper insulating layers and the underlying structure, and wherein the lower insulating layers of the first insulating layer and the second insulating layer define the lower portion of the trench, and the upper insulating layers of the first insulating layer and the second insulating layer define the upper portion of the trench.

18. The image sensor of claim 17, wherein sides of the upper insulating layers of the first insulating layer and the second insulating layer protrude from sides of the lower insulating layers of the first insulating layer and the second insulating layer toward the trench, and the lower portion of the trench undercuts the upper insulating layers of the first insulating layer and the second insulating layer.

19. The image sensor of claim 15, wherein the first insulating layer is between the first organic photoelectric converting layer and the underlying structure, and wherein a lower surface of the first organic photoelectric converting layer is higher than a lower surface of the second organic photoelectric converting layer relative to the upper surface of the underlying structure.

20. The image sensor of claim 15, wherein a lower surface of the first organic photoelectric converting layer directly contacts the first insulating layer, and wherein a lower surface of the second organic photoelectric converting layer directly contacts the underlying structure.

* * * * *